United States Patent
Jeon et al.

(10) Patent No.: US 9,092,350 B1
(45) Date of Patent: Jul. 28, 2015

(54) DETECTION AND HANDLING OF UNBALANCED ERRORS IN INTERLEAVED CODEWORDS

(71) Applicant: SanDisk Enterprise IP LLC, Milpitas, CA (US)

(72) Inventors: Seungjune Jeon, Milpitas, CA (US); Xiaoheng Chen, San Jose, CA (US)

(73) Assignee: SANDISK ENTERPRISE IP LLC, Milpitas, CA (US)

( * ) Notice: Subject to any disclaimer, the term of this patent is extended or adjusted under 35 U.S.C. 154(b) by 132 days.

(21) Appl. No.: 14/024,531

(22) Filed: Sep. 11, 2013

Related U.S. Application Data

(60) Provisional application No. 61/798,979, filed on Mar. 15, 2013.

(51) Int. Cl.

| | |
|---|---|
| *G06F 11/10* | (2006.01) |
| *G06F 11/00* | (2006.01) |
| *G06F 11/34* | (2006.01) |
| *G06F 3/06* | (2006.01) |
| G06F 9/455 | (2006.01) |
| G06F 11/30 | (2006.01) |

(52) U.S. Cl.
CPC ............ *G06F 11/10* (2013.01); *G06F 3/0604* (2013.01); *G06F 11/004* (2013.01); *G06F 11/3409* (2013.01); *G06F 11/3037* (2013.01); *G06F 2009/45583* (2013.01); *H01L 2924/1438* (2013.01); *H01L 2924/1443* (2013.01)

(58) Field of Classification Search
CPC . G06F 3/0604; G06F 11/3037; G06F 11/004; G06F 11/3409; G06F 2009/45583; G06F 11/10; H01L 2924/1438; H01L 2924/1443
See application file for complete search history.

(56) References Cited

U.S. PATENT DOCUMENTS

| | | | |
|---|---|---|---|
| 4,916,652 A | 4/1990 | Schwarz et al. | |
| 5,270,979 A | 12/1993 | Harari et al. | |
| 5,329,491 A | 7/1994 | Brown et al. | |
| 5,519,847 A | 5/1996 | Fandrich et al. | |

(Continued)

FOREIGN PATENT DOCUMENTS

| | | |
|---|---|---|
| EP | 1465203 A1 | 10/2004 |
| EP | 1 990 921 A2 | 11/2008 |

(Continued)

OTHER PUBLICATIONS

International Search Report and Written Opinion dated Jul. 25, 2014, received in International Patent Application No. PCT/US2014/029453, which corresponds to U.S. Appl. No. 13/963,444, 9 pages (Frayer).

(Continued)

*Primary Examiner* — John P Trimmings
(74) *Attorney, Agent, or Firm* — Morgan, Lewis & Bockius LLP

(57) ABSTRACT

Mechanisms are provided for detecting whether at least one of two or more portions of memory (e.g. chips, blocks, sectors, planes, pages, word lines, etc.) are more error-prone than the others, when portions of codewords are interleaved across the two or more portions of memory. Some implementations also enable various remedial operations that can be selectively employed in response to detecting an unbalanced error condition in order to reduce the risks associated with interleaving portions of codewords across two or more portions of memory.

30 Claims, 9 Drawing Sheets

(56) References Cited

U.S. PATENT DOCUMENTS

| | | |
|---|---|---|
| 5,530,705 A | 6/1996 | Malone, Sr. |
| 5,537,555 A | 7/1996 | Landry et al. |
| 5,551,003 A | 8/1996 | Mattson et al. |
| 5,657,332 A | 8/1997 | Auclair et al. |
| 5,666,114 A | 9/1997 | Brodie et al. |
| 5,708,849 A | 1/1998 | Coke et al. |
| 5,765,185 A | 6/1998 | Lambrache et al. |
| 5,943,692 A | 8/1999 | Marberg et al. |
| 5,982,664 A | 11/1999 | Watanabe |
| 6,000,006 A | 12/1999 | Bruce et al. |
| 6,006,345 A | 12/1999 | Berry, Jr. |
| 6,016,560 A | 1/2000 | Wada et al. |
| 6,018,304 A | 1/2000 | Bessios |
| 6,070,074 A | 5/2000 | Perahia et al. |
| 6,138,261 A | 10/2000 | Wilcoxson et al. |
| 6,182,264 B1 | 1/2001 | Ott |
| 6,192,092 B1 | 2/2001 | Dizon et al. |
| 6,295,592 B1 | 9/2001 | Jeddeloh |
| 6,311,263 B1 | 10/2001 | Barlow et al. |
| 6,412,042 B1 | 6/2002 | Paterson et al. |
| 6,442,076 B1 | 8/2002 | Roohparvar |
| 6,449,625 B1 | 9/2002 | Wang |
| 6,484,224 B1 | 11/2002 | Robins et al. |
| 6,516,437 B1 | 2/2003 | Van Stralen et al. |
| 6,564,285 B1 | 5/2003 | Mills et al. |
| 6,678,788 B1 | 1/2004 | O'Connell |
| 6,757,768 B1 | 6/2004 | Potter et al. |
| 6,775,792 B2 | 8/2004 | Ulrich et al. |
| 6,810,440 B2 | 10/2004 | Micalizzi, Jr. et al. |
| 6,836,808 B2 | 12/2004 | Bunce et al. |
| 6,836,815 B1 | 12/2004 | Purcell et al. |
| 6,842,436 B2 | 1/2005 | Moeller |
| 6,871,257 B2 | 3/2005 | Conley et al. |
| 6,895,464 B2 | 5/2005 | Chow et al. |
| 6,978,343 B1 | 12/2005 | Ichiriu |
| 6,980,985 B1 | 12/2005 | Amer-Yahia et al. |
| 6,981,205 B2 | 12/2005 | Fukushima et al. |
| 6,988,171 B2 | 1/2006 | Beardsley et al. |
| 7,020,017 B2 | 3/2006 | Chen et al. |
| 7,028,165 B2 | 4/2006 | Roth et al. |
| 7,032,123 B2 | 4/2006 | Kane et al. |
| 7,043,505 B1 | 5/2006 | Teague et al. |
| 7,100,002 B2 | 8/2006 | Shrader |
| 7,111,293 B1 | 9/2006 | Hersh et al. |
| 7,162,678 B2 | 1/2007 | Saliba |
| 7,173,852 B2 | 2/2007 | Gorobets et al. |
| 7,184,446 B2 | 2/2007 | Rashid et al. |
| 7,328,377 B1 | 2/2008 | Lewis et al. |
| 7,516,292 B2 | 4/2009 | Kimura et al. |
| 7,523,157 B2 | 4/2009 | Aguilar, Jr. et al. |
| 7,527,466 B2 | 5/2009 | Simmons |
| 7,529,466 B2 | 5/2009 | Takahashi |
| 7,571,277 B2 | 8/2009 | Mizushima |
| 7,574,554 B2 | 8/2009 | Tanaka et al. |
| 7,596,643 B2 | 9/2009 | Merry, Jr. et al. |
| 7,681,106 B2 | 3/2010 | Jarrar et al. |
| 7,685,494 B1 | 3/2010 | Varnica et al. |
| 7,707,481 B2 | 4/2010 | Kirschner et al. |
| 7,761,655 B2 | 7/2010 | Mizushima et al. |
| 7,774,390 B2 | 8/2010 | Shin |
| 7,840,762 B2 | 11/2010 | Oh et al. |
| 7,870,326 B2 | 1/2011 | Shin et al. |
| 7,890,818 B2 | 2/2011 | Kong et al. |
| 7,913,022 B1 | 3/2011 | Baxter |
| 7,925,960 B2 | 4/2011 | Ho et al. |
| 7,934,052 B2 | 4/2011 | Prins et al. |
| 7,954,041 B2 | 5/2011 | Hong et al. |
| 7,971,112 B2 | 6/2011 | Murata |
| 7,974,368 B2 | 7/2011 | Shieh et al. |
| 7,978,516 B2 | 7/2011 | Olbrich et al. |
| 7,996,642 B1 | 8/2011 | Smith |
| 8,006,161 B2 | 8/2011 | Lestable et al. |
| 8,032,724 B1 | 10/2011 | Smith |
| 8,042,011 B2 | 10/2011 | Nicolaidis et al. |
| 8,069,390 B2 | 11/2011 | Lin |
| 8,190,967 B2 | 5/2012 | Hong et al. |
| 8,254,181 B2 | 8/2012 | Hwang et al. |
| 8,259,506 B1 | 9/2012 | Sommer et al. |
| 8,312,349 B2 | 11/2012 | Reche et al. |
| 8,412,985 B1 | 4/2013 | Bowers et al. |
| 8,438,459 B2 | 5/2013 | Cho et al. |
| 8,453,022 B2 | 5/2013 | Katz |
| 8,634,248 B1 | 1/2014 | Sprouse et al. |
| 8,923,066 B1 | 12/2014 | Subramanian et al. |
| 2001/0050824 A1 | 12/2001 | Buch |
| 2002/0024846 A1 | 2/2002 | Kawahara et al. |
| 2002/0083299 A1 | 6/2002 | Van Huben et al. |
| 2002/0122334 A1 | 9/2002 | Lee et al. |
| 2002/0152305 A1 | 10/2002 | Jackson et al. |
| 2002/0162075 A1 | 10/2002 | Talagala et al. |
| 2002/0165896 A1 | 11/2002 | Kim |
| 2003/0041299 A1 | 2/2003 | Kanazawa et al. |
| 2003/0043829 A1 | 3/2003 | Rashid et al. |
| 2003/0088805 A1 | 5/2003 | Majni et al. |
| 2003/0093628 A1 | 5/2003 | Matter et al. |
| 2003/0163629 A1 | 8/2003 | Conley et al. |
| 2003/0188045 A1 | 10/2003 | Jacobson |
| 2003/0189856 A1 | 10/2003 | Cho et al. |
| 2003/0198100 A1 | 10/2003 | Matsushita et al. |
| 2003/0212719 A1 | 11/2003 | Yasuda et al. |
| 2004/0024957 A1 | 2/2004 | Lin et al. |
| 2004/0024963 A1 | 2/2004 | Talagala et al. |
| 2004/0057575 A1 | 3/2004 | Zhang et al. |
| 2004/0062157 A1 | 4/2004 | Kawabe |
| 2004/0073829 A1 | 4/2004 | Olarig |
| 2004/0148561 A1 | 7/2004 | Shen et al. |
| 2004/0153902 A1 | 8/2004 | Machado et al. |
| 2004/0181734 A1 | 9/2004 | Saliba |
| 2004/0199714 A1 | 10/2004 | Estakhri et al. |
| 2004/0237018 A1 | 11/2004 | Riley |
| 2005/0060456 A1 | 3/2005 | Shrader et al. |
| 2005/0060501 A1 | 3/2005 | Shrader |
| 2005/0073884 A1 | 4/2005 | Gonzalez et al. |
| 2005/0114587 A1 | 5/2005 | Chou et al. |
| 2005/0172065 A1 | 8/2005 | Keays |
| 2005/0172207 A1 | 8/2005 | Radke et al. |
| 2005/0193161 A1 | 9/2005 | Lee et al. |
| 2005/0201148 A1 | 9/2005 | Chen et al. |
| 2005/0231765 A1 | 10/2005 | So et al. |
| 2005/0249013 A1 | 11/2005 | Janzen et al. |
| 2005/0251617 A1 | 11/2005 | Sinclair et al. |
| 2005/0257120 A1 | 11/2005 | Gorobets et al. |
| 2005/0273560 A1 | 12/2005 | Hulbert et al. |
| 2005/0289314 A1 | 12/2005 | Adusumilli et al. |
| 2006/0039196 A1 | 2/2006 | Gorobets et al. |
| 2006/0039227 A1 | 2/2006 | Lai et al. |
| 2006/0053246 A1 | 3/2006 | Lee |
| 2006/0085671 A1 | 4/2006 | Majni et al. |
| 2006/0087893 A1 | 4/2006 | Nishihara et al. |
| 2006/0107181 A1 | 5/2006 | Dave et al. |
| 2006/0136570 A1 | 6/2006 | Pandya |
| 2006/0156177 A1 | 7/2006 | Kottapalli et al. |
| 2006/0195650 A1 | 8/2006 | Su et al. |
| 2006/0244049 A1 | 11/2006 | Yaoi et al. |
| 2006/0259528 A1 | 11/2006 | Dussud et al. |
| 2006/0291301 A1 | 12/2006 | Ziegelmayer |
| 2007/0011413 A1 | 1/2007 | Nonaka et al. |
| 2007/0058446 A1 | 3/2007 | Hwang et al. |
| 2007/0061597 A1 | 3/2007 | Holtzman et al. |
| 2007/0076479 A1 | 4/2007 | Kim et al. |
| 2007/0081408 A1 | 4/2007 | Kwon et al. |
| 2007/0083697 A1 | 4/2007 | Birrell et al. |
| 2007/0091677 A1 | 4/2007 | Lasser et al. |
| 2007/0113019 A1 | 5/2007 | Beukema et al. |
| 2007/0133312 A1 | 6/2007 | Roohparvar |
| 2007/0147113 A1 | 6/2007 | Mokhlesi et al. |
| 2007/0150790 A1 | 6/2007 | Gross et al. |
| 2007/0157064 A1 | 7/2007 | Falik et al. |
| 2007/0174579 A1 | 7/2007 | Shin |
| 2007/0180188 A1 | 8/2007 | Fujibayashi et al. |
| 2007/0180346 A1* | 8/2007 | Murin ............................ 714/755 |
| 2007/0201274 A1 | 8/2007 | Yu et al. |
| 2007/0208901 A1 | 9/2007 | Purcell et al. |
| 2007/0234143 A1 | 10/2007 | Kim |

(56) References Cited

U.S. PATENT DOCUMENTS

| | | |
|---|---|---|
| 2007/0245061 A1 | 10/2007 | Harriman |
| 2007/0277036 A1 | 11/2007 | Chamberlain et al. |
| 2007/0279988 A1 | 12/2007 | Nguyen |
| 2007/0291556 A1 | 12/2007 | Kamei |
| 2007/0294496 A1 | 12/2007 | Goss et al. |
| 2007/0300130 A1 | 12/2007 | Gorobets |
| 2008/0019182 A1 | 1/2008 | Yanagidaira et al. |
| 2008/0022163 A1 | 1/2008 | Tanaka et al. |
| 2008/0028275 A1 | 1/2008 | Chen et al. |
| 2008/0043871 A1 | 2/2008 | Latouche et al. |
| 2008/0052446 A1 | 2/2008 | Lasser et al. |
| 2008/0056005 A1 | 3/2008 | Aritome |
| 2008/0077841 A1 | 3/2008 | Gonzalez et al. |
| 2008/0077937 A1 | 3/2008 | Shin et al. |
| 2008/0086677 A1 | 4/2008 | Yang et al. |
| 2008/0112226 A1 | 5/2008 | Mokhlesi |
| 2008/0141043 A1 | 6/2008 | Flynn et al. |
| 2008/0144371 A1 | 6/2008 | Yeh et al. |
| 2008/0147964 A1 | 6/2008 | Chow et al. |
| 2008/0147998 A1 | 6/2008 | Jeong |
| 2008/0148124 A1 | 6/2008 | Zhang et al. |
| 2008/0163030 A1 | 7/2008 | Lee |
| 2008/0168191 A1 | 7/2008 | Biran et al. |
| 2008/0168319 A1 | 7/2008 | Lee et al. |
| 2008/0170460 A1 | 7/2008 | Oh et al. |
| 2008/0229000 A1 | 9/2008 | Kim |
| 2008/0229003 A1 | 9/2008 | Mizushima et al. |
| 2008/0229176 A1 | 9/2008 | Arnez et al. |
| 2008/0270680 A1 | 10/2008 | Chang |
| 2008/0282128 A1 | 11/2008 | Lee et al. |
| 2008/0285351 A1 | 11/2008 | Shlick et al. |
| 2008/0313132 A1 | 12/2008 | Hao et al. |
| 2009/0003058 A1 | 1/2009 | Kang |
| 2009/0037652 A1 | 2/2009 | Yu et al. |
| 2009/0116283 A1 | 5/2009 | Ha et al. |
| 2009/0125671 A1 | 5/2009 | Flynn et al. |
| 2009/0144598 A1 | 6/2009 | Yoon et al. |
| 2009/0168525 A1 | 7/2009 | Olbrich et al. |
| 2009/0172258 A1 | 7/2009 | Olbrich et al. |
| 2009/0172259 A1 | 7/2009 | Prins et al. |
| 2009/0172260 A1 | 7/2009 | Olbrich et al. |
| 2009/0172261 A1 | 7/2009 | Prins et al. |
| 2009/0172262 A1 | 7/2009 | Olbrich et al. |
| 2009/0172308 A1 | 7/2009 | Prins et al. |
| 2009/0172335 A1 | 7/2009 | Kulkarni et al. |
| 2009/0172499 A1 | 7/2009 | Olbrich et al. |
| 2009/0193058 A1 | 7/2009 | Reid |
| 2009/0207660 A1 | 8/2009 | Hwang et al. |
| 2009/0222708 A1 | 9/2009 | Yamaga |
| 2009/0228761 A1 | 9/2009 | Perlmutter et al. |
| 2009/0249160 A1 | 10/2009 | Gao et al. |
| 2009/0268521 A1 | 10/2009 | Ueno et al. |
| 2009/0292972 A1 | 11/2009 | Seol et al. |
| 2009/0296466 A1 | 12/2009 | Kim et al. |
| 2009/0296486 A1 | 12/2009 | Kim et al. |
| 2009/0310422 A1 | 12/2009 | Edahiro et al. |
| 2009/0319864 A1 | 12/2009 | Shrader |
| 2010/0002506 A1 | 1/2010 | Cho et al. |
| 2010/0020620 A1* | 1/2010 | Kim et al. ............... 365/185.24 |
| 2010/0037012 A1 | 2/2010 | Yano et al. |
| 2010/0061151 A1 | 3/2010 | Miwa et al. |
| 2010/0091535 A1 | 4/2010 | Sommer et al. |
| 2010/0103737 A1 | 4/2010 | Park |
| 2010/0110798 A1 | 5/2010 | Hoei et al. |
| 2010/0118608 A1 | 5/2010 | Song et al. |
| 2010/0153616 A1 | 6/2010 | Garratt |
| 2010/0161936 A1 | 6/2010 | Royer et al. |
| 2010/0174959 A1 | 7/2010 | No et al. |
| 2010/0199125 A1 | 8/2010 | Reche |
| 2010/0202196 A1 | 8/2010 | Lee et al. |
| 2010/0208521 A1 | 8/2010 | Kim et al. |
| 2010/0262889 A1 | 10/2010 | Bains |
| 2010/0281207 A1 | 11/2010 | Miller et al. |
| 2010/0281342 A1 | 11/2010 | Chang et al. |
| 2011/0051513 A1 | 3/2011 | Shen et al. |
| 2011/0083060 A1 | 4/2011 | Sakurada et al. |
| 2011/0113281 A1 | 5/2011 | Zhang et al. |
| 2011/0131444 A1 | 6/2011 | Buch et al. |
| 2011/0173378 A1 | 7/2011 | Filor et al. |
| 2011/0199825 A1 | 8/2011 | Han et al. |
| 2011/0205823 A1 | 8/2011 | Hemink et al. |
| 2011/0213920 A1 | 9/2011 | Frost et al. |
| 2011/0228601 A1 | 9/2011 | Olbrich et al. |
| 2011/0231600 A1 | 9/2011 | Tanaka et al. |
| 2012/0096217 A1 | 4/2012 | Son et al. |
| 2012/0110250 A1 | 5/2012 | Sabbag et al. |
| 2012/0151124 A1 | 6/2012 | Baek et al. |
| 2012/0151253 A1 | 6/2012 | Horn |
| 2012/0151294 A1 | 6/2012 | Yoo et al. |
| 2012/0185750 A1 | 7/2012 | Hayami |
| 2012/0195126 A1 | 8/2012 | Roohparvar |
| 2012/0233391 A1 | 9/2012 | Frost et al. |
| 2012/0239858 A1 | 9/2012 | Melik-Martirosian |
| 2012/0239976 A1 | 9/2012 | Cometti et al. |
| 2012/0284587 A1 | 11/2012 | Yu et al. |
| 2013/0031438 A1 | 1/2013 | Hu et al. |
| 2013/0036418 A1 | 2/2013 | Yadappanavar et al. |
| 2013/0047045 A1 | 2/2013 | Hu et al. |
| 2013/0073924 A1 | 3/2013 | D'Abreu et al. |
| 2013/0111279 A1 | 5/2013 | Jeon et al. |
| 2013/0121084 A1 | 5/2013 | Jeon et al. |
| 2013/0132652 A1 | 5/2013 | Wood et al. |
| 2013/0176784 A1 | 7/2013 | Cometti et al. |
| 2013/0179646 A1 | 7/2013 | Okubo et al. |
| 2013/0232289 A1 | 9/2013 | Zhong et al. |
| 2013/0258738 A1 | 10/2013 | Barkon et al. |
| 2013/0265838 A1 | 10/2013 | Li |
| 2013/0301373 A1 | 11/2013 | Tam |
| 2013/0343131 A1 | 12/2013 | Wu et al. |
| 2014/0013188 A1 | 1/2014 | Wu et al. |
| 2014/0063905 A1 | 3/2014 | Ahn et al. |
| 2014/0095775 A1 | 4/2014 | Talagala et al. |
| 2014/0122818 A1 | 5/2014 | Hayasaka et al. |
| 2014/0136927 A1 | 5/2014 | Li et al. |
| 2014/0143505 A1 | 5/2014 | Sim et al. |
| 2014/0201596 A1 | 7/2014 | Baum et al. |
| 2014/0359381 A1* | 12/2014 | Takeuchi et al. ............... 714/704 |

FOREIGN PATENT DOCUMENTS

| | | | |
|---|---|---|---|
| EP | 2 620 946 A2 | | 7/2013 |
| JP | 2002-532806 S | | 10/2002 |
| WO | WO 2007/036834 A2 | | 4/2007 |
| WO | WO 2007/080586 A2 | | 7/2007 |
| WO | WO 2008/075292 | | 6/2008 |
| WO | WO 2008/121553 A1 | | 10/2008 |
| WO | WO 2008/121577 A1 | | 10/2008 |
| WO | WO 2009/028281 A1 | | 3/2009 |
| WO | WO 2009/032945 A1 | | 3/2009 |
| WO | WO 2009/058140 A1 | | 5/2009 |
| WO | WO 2009/084724 | | 7/2009 |
| WO | WO 2009/134576 A1 | | 11/2009 |
| WO | WO 2011/024015 | | 3/2011 |

OTHER PUBLICATIONS

International Search Report and Written Opinion dated Mar. 7, 2014, received in International Patent Application No. PCT/US2013/074772, which corresponds to U.S. Appl. No. 13/831,218, 10 pages (George).

International Search Report and Written Opinion dated Mar. 24, 2014, received in International Patent Application No. PCT/US2013/074777, which corresponds to U.S. Appl. No. 13/831,308, 10 pages (George).

International Search Report and Written Opinion dated Mar. 7, 2014, received in International Patent Application No. PCT/US2013/074779, which corresponds to U.S. Appl. No. 13/831,374, 8 pages (George).

Barr, Introduction to Watchdog Timers, Oct. 2001, 3 pgs.

Canim, Buffered Bloom ilters on Solid State Storage, ADMS*10, Singapore, Sep. 13-17, 2010, 8 pgs.

(56) References Cited

OTHER PUBLICATIONS

Kang, A Multi-Channel Architecture for High-Performance NAND Flash-Based Storage System, J. Syst. Archit., 53, Sep. 9, 2007, 15 pgs.
Kim, A Space-Efficient Flash Translation Layer for CompactFlash Systems, May 2002, 10 pgs.
Lu, A Forest-structured Bloom Filter with Flash Memory, MSST 2011, Denver, Co, May 23-27, 2011, article, 6 pgs.
Lu, A Forest-structured Bloom Filter with Flash Memory, MSST 2011, Denver, Co, May 23-27, 2011, presentation slides, 25 pgs.
McLean, Information Technology—AT Attachment with Packet Interface Extension, Aug. 19, 1998, 339 pgs.
Park, A High Performance Controller for NAND Flash-Based Solid State Disk (NSSD), Feb. 12-16, 2006, 4 pgs.
Pliant Technology, International Search Report / Written Opinion, PCT/US08/88133, Mar. 19, 2009, 7 pgs.
Pliant Technology, International Search Report / Written Opinion, PCT/US08/88136, Mar. 19, 2009, 7 pgs.
Pliant Technology, International Search Report / Written Opinion, PCT/US08/88146, Feb. 26, 2009, 10 pgs.
Pliant Technology, International Search Report / Written Opinion, PCT/US08/88154, Feb. 27, 2009, 8 pgs.
Pliant Technology, International Search Report / Written Opinion, PCT/US08/88164, Feb. 13, 2009, 6 pgs.
Pliant Technology, International Search Report / Written Opinion, PCT/US08/88206, Feb. 18, 2009, 8 pgs.
Pliant Technology, International Search Report / Written Opinion, PCT/US08/88217, Feb. 19, 2009, 7 pgs.
Pliant Technology, International Search Report / Written Opinion, PCT/US08/88229, Feb. 13, 2009, 7 pgs.
Pliant Technology, International Search Report / Written Opinion, PCT/US08/88232, Feb. 19, 2009, 8 pgs.
Pliant Technology, International Search Report / Written Opinion, PCT/US08/88236, Feb. 19, 2009, 7 pgs.
Pliant Technology, International Search Report / Written Opinion, PCT/US2011/028637, Oct. 27, 2011, 11 pgs.
Pliant Technology, Supplementary ESR, 08866997.3, Feb. 23, 2012, 6 pgs.
SanDisk Enterprise IP LLC, International Search Report / Written Opinion, PCT/US2012/042764, Aug. 31, 2012, 12 pgs.
SanDisk Enterprise IP LLC, International Search Report / Written Opinion, PCT/US2012/042771, Mar. 4, 2013, 14 pgs.
SanDisk Enterprise IP LLC, International Search Report / Written Opinion, PCT/US2012/042775, Sep. 26, 2012, 8 pgs.
SanDisk Enterprise IP LLC, International Search Report / Written Opinion, PCT/US2012/059447, Jun. 6, 2013, 12 pgs.
SanDisk Enterprise IP LLC, International Search Report / Written Opinion, PCT/US2012/059453, Jun. 6, 2013, 12 pgs.
Sandisk Enterprise IP LLC, International Search Report / Written Opinion, PCT/US2012/059459, Feb. 14, 2013, 9 pgs.
SanDisk Enterprise IP LLC, International Search Report / Written Opinion, PCT/US2012/065914, May 23, 2013, 7 pgs.
SanDisk Enterprise IP LLC, International Search Report / Written Opinion, PCT/US2012/065916, Apr. 5, 2013, 7 pgs.
SanDisk Enterprise IP LLC, International Search Report / Written Opinion, PCT/US2012/065919, Jun. 17, 2013, 8 pgs.
SanDisk Enterprise IP LLC, Notification of the Decision to Grant a Patent Right for Patent for Invention, CN 200880127623.8, Jul. 4, 2013, 1 pg.
SanDisk Enterprise IP LLC, Office Action, CN 200880127623.8, Apr. 18, 2012, 12 pgs.
SanDisk Enterprise IP LLC, Office Action, CN 200880127623.8, Dec. 31, 2012, 9 pgs.
SanDisk Enterprise IP LLC, Office Action, JP 2010-540863, Jul. 24, 2012, 3 pgs.
Watchdog Timer and Power Savin Modes, Microchip Technology Inc., 2005, 14 pgs.
Zeidman, 1999 Verilog Designer's Library, 9 pgs.
Invitation to Pay Additional Fees dated Feb. 13, 2015, received in International Patent Application No. PCT/US2014/063949, which corresponds to U.S. Appl. No. 14/135,433, 6 pages (Delpapa).
International Search Report and Written Opinion dated Jan. 21, 2015, received in International Application No. PCT/US2014/059748, which corresponds to U.S. Appl. No. 14/137,511, 13 pages (Dancho).
International Search Report and Written Opinion dated Feb. 18, 2015, received in International Application No. PCT/US2014/068921, which corresponds to U.S. Appl. No. 14/135,260, 13 pages (Fitzpatrick).

* cited by examiner

Figure 4B

DETECTION AND HANDLING OF UNBALANCED ERRORS IN INTERLEAVED CODEWORDS

RELATED APPLICATIONS

This application claims priority to U.S. Provisional Patent Application 61/798,979, filed Mar. 15, 2013, which is hereby incorporated by reference in its entirety.

TECHNICAL FIELD

This disclosure relates to error control in memory systems, and in particular, to using sub-matrix error detection to manage data stored in two or more portions of memory.

BACKGROUND

Semiconductor memory devices, including flash memory, typically utilize memory cells to store data as an electrical value, such as an electrical charge or voltage. A flash memory cell, for example, includes a single transistor with a floating gate that is used to store a charge representative of a data value. Increases in storage density have been facilitated in various ways, including increasing the density of memory cells on a chip enabled by manufacturing developments, and transitioning from single-level flash memory cells to multi-level flash memory cells, so that two or more bits can be stored by each flash memory cell.

A drawback of increasing storage density is that the stored data is increasingly prone to being stored and/or read erroneously. An error control coding (ECC) engine is utilized to limit the number of uncorrectable errors that are introduced by electrical fluctuations, defects in the storage medium, operating conditions, device history, and/or write-read circuitry, etc.

Performance variability can be especially problematic when an interleaving scheme is used. Interleaving is generally employed to normalize the distribution of errors throughout a codeword or a set of codewords so that the quantity and distribution of errors falls within the error correcting capability of the ECC used to encode data into a set of one or more codewords. To that end, as an example, one interleaving scheme includes dividing a codeword into portions and assigning the codeword portions to respective memory devices in the memory system, so that each memory device stores a portion of the codeword. The result is that the average number of errors introduced by each memory device is spread over a set of codewords so that no one codeword is adversely affected by a particularly error-prone memory device disproportionately more than the other codewords. A drawback, however, is that such an interleaving scheme introduces the risk that one particularly error-prone memory device in the memory system can cause a catastrophic loss of data from multiple codewords. For example, the errors introduced in one portion of a codeword by one memory device may be so severe that the entire codeword is uncorrectable, irrespective of the performance of the other memory devices. If that one memory device has substantially the same impact on a set of codewords, large amounts of data may be irrecoverable because of the errors caused by the one memory device.

SUMMARY

Method and mechanisms are provided to estimate error propensities of two or more portions of memory (e.g. chips, blocks, sectors, planes, pages, word lines, etc.) using at least one codeword that includes two or more portions respectively stored in the two or more portions of memory. In turn, the estimated error propensities are used to enable remedial operations, such as adjusting reading signal values and/or adjusting soft information values derived from successive read operations.

BRIEF DESCRIPTION OF THE DRAWINGS

So that the present disclosure can be understood in greater detail, a more particular description may be had by reference to aspects of various implementations, some of which are illustrated in the appended drawings. The appended drawings, however, merely illustrate the more pertinent aspects of the present disclosure and are therefore not to be considered limiting, for the description may admit to other effective aspects and features.

FIG. 4B is a schematic diagram of another example implementation of a parity check matrix for a low density parity check (LDPC) code configured to enable sub-matrix error detection for portions of an entire codeword, in accordance with some embodiments.

Figure 1:
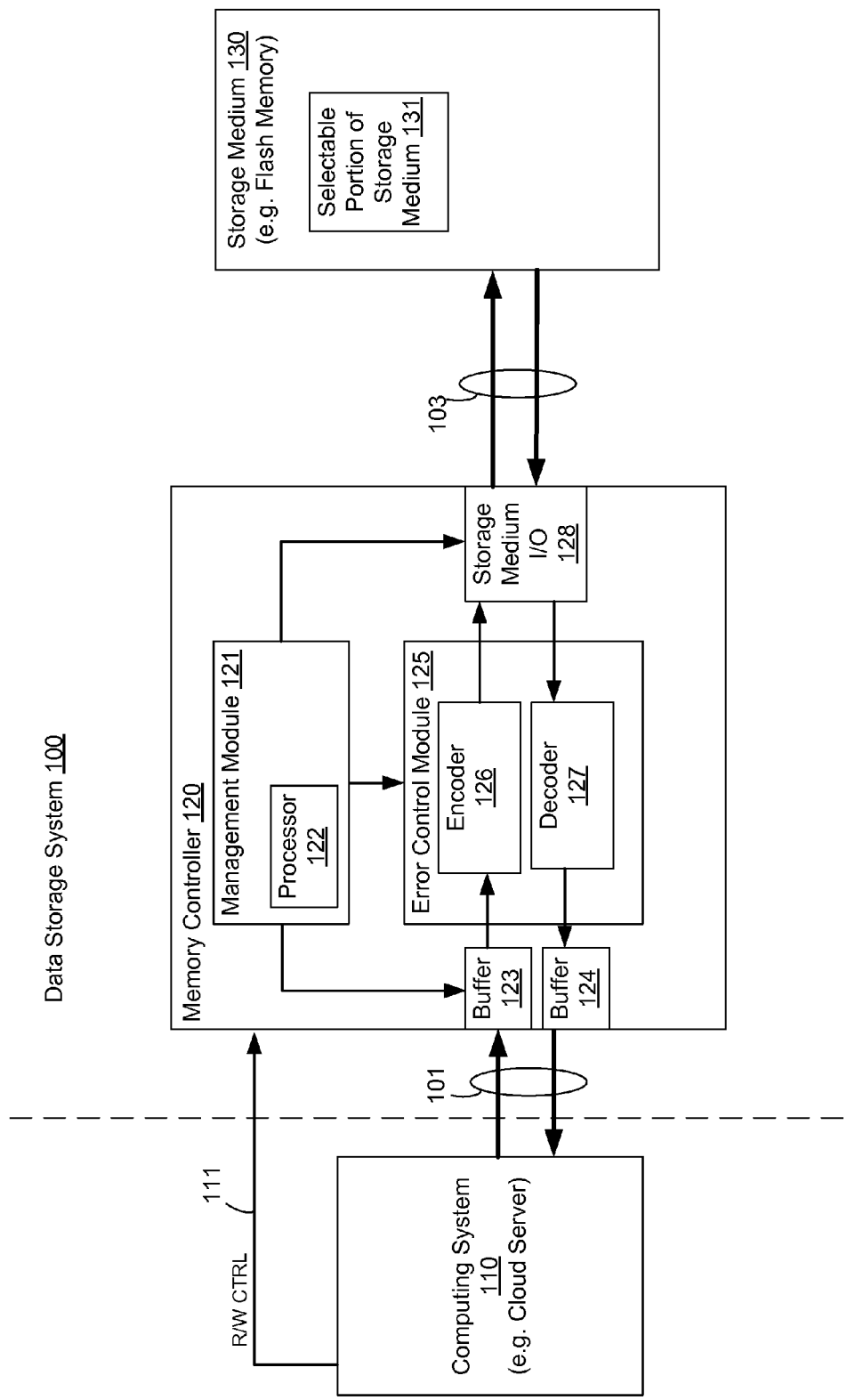
FIG. 1 is a diagram of an implementation of a data storage system, in accordance with some embodiments.

In accordance with common practice the various features illustrated in the drawings may not be drawn to scale. The dimensions of the various features may be arbitrarily expanded or reduced for clarity. In addition, some of the drawings may not depict all of the components of a given system, method or device. Finally, like reference numerals may be used to denote like features throughout the specification and figures.

DETAILED DESCRIPTION

As noted above, interleaving portions of codewords across two or more portions of memory introduces the risk that one particularly error-prone memory device can cause a catastrophic loss of data from multiple codewords. By contrast, the various implementations described herein provide a mechanism for detecting whether at least one of two or more portions of memory (e.g. chips, blocks, sectors, planes, pages, word lines, etc.) are more error-prone than the others, when portions of codewords are interleaved across the two or more portions of memory. Some implementations also enable various remedial operations that can be selectively employed in response to detecting an unbalanced error condition in order to reduce the risks associated with interleaving portions of codewords across two or more portions of memory.

Some implementations include systems, methods and/or devices that utilize an error control code configured to have the capacity to permit error detection for individual portions of a codeword, in addition to the capacity to permit error detection for the entire codeword. In some implementations, a parity check matrix H of an error control code is modified to include two or more sub-matrices that can be used to detect errors in corresponding two or more portions of a codeword produced using a generator matrix G of the error control code. Consequently, when used in a system that interleaves two or more portions of a codeword across two or more portions of memory, performing error detection on each of the two or more portions of the codeword using the corresponding sub-matrices provides a mechanism for estimating the respective error propensities of the two or more portions of memory. In some implementations, the estimated error propensities enable the use of various remedial operations that can be selectively employed in response to detecting that at least one of the two or more portions of memory is relatively more error-prone than the others.

Numerous details are described herein in order to provide a thorough understanding of example implementations illustrated in the accompanying drawings. However, the invention may be practiced without many of the specific details and is only limited by the language of the claims. Well-known methods, components, and circuits have not been described in exhaustive detail so as not to unnecessarily obscure more pertinent aspects of the implementations described herein.

FIG. 1 is a diagram of an implementation of a data storage system 100, in accordance with some embodiments. While some example features are illustrated, various other features have not been illustrated for the sake of brevity and so as not to obscure more pertinent aspects of the example implementations disclosed herein. To that end, as a non-limiting example, data storage system 100 includes a memory controller 120, and a storage medium 130, and is used in conjunction with computer system 110. In some implementations, storage medium 130 is a single flash memory device while in other implementations storage medium 130 includes a plurality of flash memory devices. In some implementations, storage medium 130 is NAND-type flash memory or NOR-type flash memory. Various other types of storage media may be included in other implementations. Further, in some implementations memory controller 120 is a solid-state drive (SSD) controller.

Computer system 110 is coupled to memory controller 120 through data connections 101. However, in some implementations computer system 110 includes memory controller 120 as a component and/or a sub-system. Computer system 110 may be any suitable computer device, such as a computer, a laptop computer, a tablet device, a netbook, an internet kiosk, a personal digital assistant, a mobile phone, a smart phone, a gaming device, a computer server, or any other computing device. Computer system 110 is sometimes called a host or host system. In some implementations, computer system 110 includes one or more processors, one or more types of memory, a display and/or other user interface components such as a keyboard, a touch screen display, a mouse, a trackpad, a digital camera and/or any number of supplemental devices to add functionality.

Storage medium 130 is coupled to memory controller 120 through connections 103. Connections 103 are sometimes called data connections, but typically convey commands in addition to data, and optionally convey metadata, error correction information and/or other information in addition to data values to be stored in storage medium 130 and data values read from storage medium 130. In some implementations, however, memory controller 120 and storage medium 130 are included in the same device as components thereof. Furthermore, in some implementations memory controller 120 and storage medium 130 are embedded in a host device, such as a mobile device, tablet, other computer or computer controlled device, and the methods described herein are performed by the embedded memory controller. Storage medium 130 may include any number (i.e., one or more) of memory devices including, without limitation, non-volatile semiconductor memory devices, such as flash memory. For example, flash memory devices can be configured for enterprise storage suitable for applications such as cloud computing, or for caching data stored (or to be stored) in secondary storage, such as hard disk drives. Additionally and/or alternatively, flash memory can also be configured for relatively smaller-scale applications such as personal flash drives or hard-disk replacements for personal, laptop and tablet computers.

Storage medium 130 is divided into a number of addressable and individually selectable blocks, such as selectable portion 131. In some implementations, the individually selectable blocks are the minimum size erasable units in a flash memory device. In other words, each block contains the minimum number of memory cells that can be erased simultaneously. Each block is usually further divided into a plurality of pages and/or word lines, where each page or word line is typically an instance of the smallest individually accessible (readable) portion in a block. In some implementations (e.g., using some types of flash memory) the smallest individually accessible unit of a data set is a sector, which is a subunit of a page. That is, block includes a plurality of pages, each page contains a plurality of sectors, and each sector is the minimum unit of data for reading data from the flash memory device.

For example, one block comprises any number of pages, for example, 64 pages, 128 pages, 256 pages, or another suitable number of pages. Blocks are typically grouped into a plurality of zones. Each block zone can be independently managed to some extent, which increases the degree of parallelism for parallel operations and simplifies management of storage medium 130.

As noted above, while data storage densities of non-volatile semiconductor memory devices are generally increasing, a drawback of increasing storage density is that the stored data is more prone to being stored and/or read erroneously. As described in greater detail below, error control coding can be utilized to limit the number of uncorrectable errors that are introduced by electrical fluctuations, defects in the storage medium, operating conditions, device history, write-read circuitry, etc., or a combination of these and various other factors.

In some implementations, memory controller 120 includes a management module 121, an input buffer 123, an output buffer 124, an error control module 125 and a storage medium interface (I/O) 128. Memory controller 120 may include various additional features that have not been illustrated for the sake of brevity and so as not to obscure more pertinent features of the example implementations disclosed herein, and that a different arrangement of features may be possible. Input and output buffers 123,124 provide an interface to computer system 110 through data connections 101. Similarly, storage medium I/O 128 provides an interface to storage medium 130 though connections 103. In some implementations, storage medium I/O 128 includes read and write circuitry, including circuitry capable of providing reading signals to storage medium 130 (e.g., reading threshold voltages for NAND-type flash memory).

In some implementations, management module 121 includes one or more processing units (CPUs, also sometimes called processors) 122 configured to execute instructions in one or more programs (e.g., in management module 121). In some implementations, the one or more processors 122 are shared by one or more components within, and in some cases, beyond the function of memory controller 120. Management module 121 is coupled to input buffer 123, output buffer 124 (connection not shown), error control module 125 and storage medium I/O 128 in order to coordinate the operation of these components.

Error control module 125 is coupled to storage medium I/O 128, input buffer 123 and output buffer 124. Error control module 125 is provided to limit the number of uncorrectable errors inadvertently introduced into data. In some embodiments, error control module 125 is executed in software by the one or more processors 122 of management module 121, and, in other embodiments, error control module 125 is implemented in whole or in part using special purpose circuitry to perform encoding and decoding functions. To that end, error control module 125 includes an encoder 126 and a decoder 127. Encoder 126 encodes data by applying an error control code to produce a codeword, which is subsequently stored in storage medium 130.

When the encoded data (e.g., one or more codewords) is read from the storage medium 130, decoder 127 applies a decoding process to the encoded data to recover the data, and to correct errors in the recovered data within the error correcting capability of the error control code. Those skilled in the art will appreciate that various error control codes have different error detection and correction capacities, and that particular codes are selected for various applications for reasons beyond the scope of this disclosure. As such, an exhaustive review of the various types of error control codes is not provided herein. Moreover, those skilled in the art will appreciate that each type or family of error control codes may have encoding and decoding algorithms that are particular to the type or family of error control codes. On the other hand some algorithms, such as the Viterbi algorithm, may be utilized at least to some extent in the decoding of a number of different types or families of error control codes. As such, for the sake of brevity, an exhaustive description of the various types of encoding and decoding algorithms generally available and known to those skilled in the art is not provided herein.

During a write operation, input buffer 123 receives data to be stored in storage medium 130 from computer system 110. The data held in input buffer 123 is made available to encoder 126, which encodes the data to produce one or more codewords. The one or more codewords are made available to storage medium I/O 128, which transfers the one or more codewords to storage medium 130 in a manner dependent on the type of storage medium being utilized.

A read operation is initiated when computer system (host) 110 sends one or more host read commands on control line 111 to memory controller 120 requesting data from storage medium 130. Memory controller 120 sends one or more read access commands to storage medium 130, via storage medium I/O 128, to obtain raw read data in accordance with memory locations (addresses) specified by the one or more host read commands. Storage medium I/O 128 provides the raw read data (e.g., comprising one or more codewords) to decoder 127. If the decoding is successful, the decoded data is provided to output buffer 124, where the decoded data is made available to computer system 110. In some implementations, if the decoding is not successful, memory controller 120 may resort to a number of remedial actions or provide an indication of an irresolvable error condition.

For many error control codes, the decoding process can be improved by using soft information, which takes into consideration the probabilities of interpreting the output of read operations in more than one way. Hard information decoding generally means that absolute decisions are made as to whether a data value (e.g., data-bit or code-bit) is one symbol or another in a particular symbol alphabet. For example, in a binary system, a particular data value can be either "0" or "1", even if the raw electrical analog value read from a storage location does not indicate that the electrical value representing the data value is sufficient to decide with certainty that the data value is "0" or "1." In other words, a hard-decision for a particular data value is based on the most likely symbol corresponding to the analog electrical value read from the storage medium, and the probabilities that alternative decisions may be true are ignored by the hard-decision process. Often the hard-decision is based on the Euclidian distances from the analog read value to electrical level(s) defining the symbols. By contrast, the use of soft information does not ignore the probabilities that different outcomes may be true in view of what is read from the storage medium. Error control methods using soft information are particularly promising because soft information decoding often improves the error detection and correction capability of a particular error control code, and thus the capacity of the system.

As discussed in more detail below, some implementations include systems, methods and/or devices enabled to utilize soft information error correction decoding to support the use of flash memory or other storage mediums. To that end, raw read data from each memory location forms a corresponding bit-tuple representing the result of a number of sequential read operations. The bit-tuple is then used to retrieve a soft information value (e.g., a log-likelihood ratio, LLR) from a stored characterization vector associated with the current state of the storage medium, as identified by a set of storage medium characterization parameter values. In some implementations, delay is reduced by looking up a soft information value in a characterization vector based on a bit-tuple rather than computing the soft information value from the raw read data.

Flash memory devices utilize memory cells to store data as electrical values, such as electrical charges or voltages. Each flash memory cell typically includes a single transistor with a floating gate that is used to store a charge, which modifies the threshold voltage of the transistor (i.e., the voltage needed to turn the transistor on). The magnitude of the charge, and the corresponding threshold voltage the charge creates, is used to represent one or more data values. In some implementations, during a read operation, a reading threshold voltage is applied to the control gate of the transistor and the resulting sensed current or voltage is mapped to a data value.

The terms "cell voltage" and "memory cell voltage," in the context of flash memory cells, means the threshold voltage of the memory cell, which is the minimum voltage that needs to be applied to the gate of the memory cell's transistor in order for the transistor to conduct current. Similarly, reading threshold voltages (sometimes called reading signals and/or reading voltages) applied to a flash memory cells are gate voltages applied to the gates of the flash memory cells to determine whether the memory cells conduct current at that gate voltage. In some implementations, when a flash memory cell's transistor conducts current at a given reading threshold voltage, indicating that the cell voltage is less than the reading threshold voltage, the raw data value for that read operation is a "1" and otherwise the raw data value is a "0."

In some implementations, the memory cell voltage of a memory cell is read indirectly, by reading the memory cell using one or more reading threshold voltages. More specifically, each read operation produces a result that indicates whether the cell voltage of the memory cell is greater than or less than the reading threshold voltage used during that read operation. By reading the memory cell using multiple reading threshold voltages, the cell voltage can be determine more precisely than if the memory cell were read using only a single reading threshold voltage. Stated another way, the more read operations that are performed on a memory cell, each using a different reading threshold voltage, the more precisely the cell voltage of the memory cell is known.

A single-level flash memory cell (SLC) stores one bit of information ("0" or "1"). So the storage density of a SLC memory device is one bit per memory cell. On the other hand, a multi-level flash memory cell (MLC) can store two or more bits by using different ranges within the total voltage range of the memory cell to represent a multi-bit bit-tuple. In turn, the storage density of a MLC memory device is multiple-bits per cell (e.g., two bits per memory cell).

As discussed below with reference to FIG. 2B, a MLC memory device is used to store multiple bits by using voltage ranges within the total voltage range of a memory cell to represent different bit-tuples. A MLC memory device is typically more error-prone than a SLC memory device created using the same manufacturing process because the effective voltage difference between the voltages used to store different data values is smaller for a MLC memory device. Moreover, due to a number of error-inducing factors, a typical error includes the cell voltage of a particular MLC shifting to a voltage range that is adjacent to the voltage range that would otherwise be representative of the correct bit-tuple. Such error-inducing factors include, without limitation, electrical fluctuations, defects in the storage medium, operating conditions, device history (e.g., a count of the number of program-erase (P/E) cycles performed by the storage device), suboptimal performance or design and/or degradation of write-read circuitry, or a combination of these and other factors. As discussed in greater detail below with reference to FIG. 2B, the impact of such errors can be reduced by grey-coding the data, such that there are only single-bit changes between bit-tuples in adjacent voltage ranges.

Figure 2A:
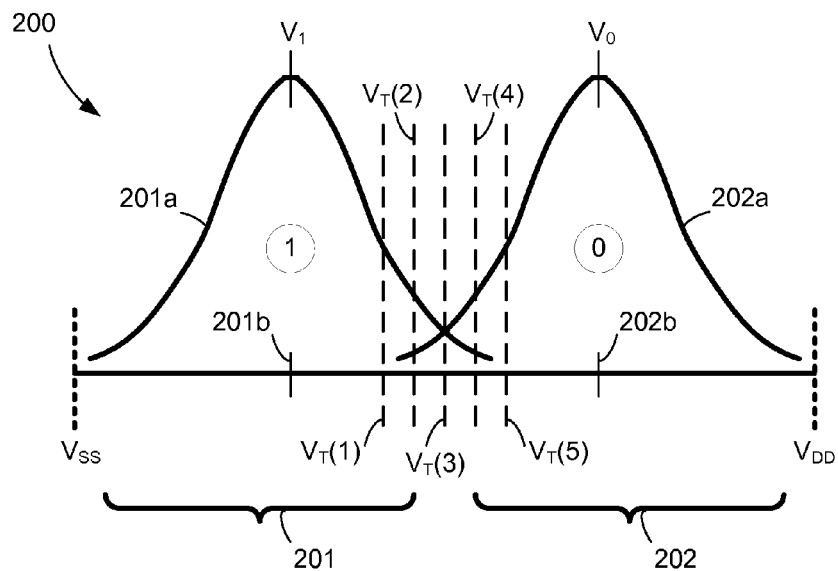
FIG. 2A is a prophetic diagram of voltage distributions that may be found in a single-level flash memory cell (SLC) over time and a number of reading threshold voltages, in accordance with some embodiments.

One strategy used to characterize and/or read a data value stored in a memory location is to read the memory location multiple times, using a plurality of distinct reading threshold voltages distributed across the transition or overlap between adjacent voltage ranges in the memory cell. For example, FIG. 2A is a simplified prophetic diagram of voltage distributions 200 that may be found in a single-level (SLC) flash memory cell over time, and a sequence of reading threshold voltages $V_T(1), V_T(2), V_T(3), V_T(4), V_T(5)$ that are applied to the SLC during a sequential set of read operations according to some implementations. Those skilled in the art will appreciate from the present disclosure that the voltage distributions 200 have been simplified for illustrative purposes. In this example, the SLC memory cell voltage range approximately extends from a voltage, $V_{SS}$, at the source terminal of a NMOS transistor to a voltage, $V_{DD}$, at the drain terminal of the same NMOS transistor. As such, voltage distributions 200 extend between $V_{SS}$ and $V_{DD}$.

Sequential voltage ranges 201, 202 between the source and drain voltages, $V_{SS}$ and $V_{DD}$, are used to represent corresponding bit values "1" and "0," respectively. Each voltage range 201 and 202 has a respective center voltage $V_1$ 201b and $V_0$ 202b. Each voltage range 201 and 202 also has a respective distribution of voltages 201a and 202a that may occur as a result of any number of a combination of error-inducing factors, examples of which are identified above.

Preferably, during a write operation, to write a respective desired bit value to a SLC flash memory cell the charge on the floating gate of the SLC flash memory cell is set such that the resultant cell voltage (i.e., the cell's resultant threshold voltage) is at the center of one of the ranges 201, 202. In other words, the resultant cell voltage is, ideally, set to one of $V_1$ 201b and $V_0$ 202b in order to write a respective one of the bit values "1" and "0." Under typical operating conditions, however, due in part to the error-inducing factors described above, the actual cell voltage may differ from the center voltage for the data written to the SLC flash memory cell.

In some implementations, reading threshold voltages $V_T(1), V_T(2), V_T(3), V_T(4), V_T(5)$ are applied between adjacent center voltages, e.g., applied proximate to the halfway region between adjacent center voltages $V_1$ 201b, and $V_0$ 202b. Optionally, in some implementations, some or all of the reading threshold voltages are located between voltage ranges 201, 202. In some implementations, reading threshold voltages $V_T(1), V_T(2), V_T(3), V_T(4), V_T(5)$ are applied in the region proximate to where the voltage distributions 201a, 202a overlap, which is not necessarily proximate to the halfway region between adjacent center voltages $V_1$ 201b, and $V_0$ 202b. In some implementations, during a sequence of read operations, reading threshold voltages $V_T(1), V_T(2), V_T(3), V_T(4), V_T(5)$ are sequentially applied, such that the application of each reading threshold voltage yields a raw read data value associated with each memory cell that is read. Consequently, for reading threshold voltages $V_T(1), V_T(2), V_T(3), V_T(4), V_T(5)$, five separate raw read data values are obtained for each memory location. Those skilled in the art will appreciate that any number of two or more reading threshold voltages can be used in various implementations, and that the five reading threshold voltages described with reference FIG. 2A are merely provided as an illustrative example.

As described above, in many circumstances the memory cell current sensed in response to the applied reading threshold voltages $V_T(1), V_T(2), V_T(3), V_T(4), V_T(5)$ is indicative of a memory cell voltage different from the respective center voltage $V_1$ 201b or $V_0$ 202b corresponding to the respective bit value written into the memory cell. Errors in cell voltage, and/or the cell voltage sensed when reading the memory cell, can occur during write operations, read operations, or due to "drift" of the cell voltage between the time data is written to the memory cell and the time a read operation is performed to read the data stored in the memory cell. For ease of discussion, these effects are collectively described as "cell voltage drift."

Again, as compared to a SLC, a MLC memory device is used to store multiple bits by using four or more distinct voltage ranges within the total voltage range of the memory cell to represent different bit-tuples. FIG. 2B is a simplified, prophetic diagram of memory cell voltage distributions 210a found in the memory cells of a MLC memory device over time and a sequence of reading threshold voltages $V_{Ta}(1), V_{Ta}(2), V_{Ta}(3), V_{Ta}(4), V_{Ta}(5)$ that are applied to memory cells of the MLC memory device during a sequential set of read operations for a lower page read according to some implementations. Similar to a SLC, the cell voltage range of a MLC approximately extends from the voltage, $V_{SS}$, at the source terminal of a NMOS transistor to the voltage, $V_{DD}$, at the drain terminal of the NMOS transistor. As such, voltage distributions 210a extend between $V_{SS}$ and $V_{DD}$.

Sequential voltage ranges 211, 212, 213, 214 between the source and drain voltages, $V_{SS}$ and $V_{DD}$, are used to represent corresponding bit-tuples "11", "01", "00", "10", respectively. Each voltage range 211, 212, 213, 214 has a respective center voltage 211b, 212b, 213b, 214b. Each voltage range 211, 212, 213, 214 also has a respective distribution of voltages 211a, 212a, 213a, 214a that may occur as a result of any number or combination of the error-inducing factors described above.

As noted above, errors in the cell voltage of a MLC and/or the cell voltage sensed are sometimes caused by the cell voltage drifting to a range corresponding to a different bit-tuple from the correct voltage range of the bit-tuple written to the MLC. One way to reduce the impact of a cell voltage drifting from one voltage range to an adjacent voltage range is to grey-code the bit-tuples. Grey-coding the bit-tuples includes constraining the assignment of bit-tuples to memory cell voltage ranges such that the respective bit-tuple of a particular voltage range is different from the respective bit-tuple of an adjacent voltage range by only one bit. For example, as shown in FIG. 2B, the corresponding bit-tuples for the adjacent ranges 211 and 212 are respectively "11" and "01", the corresponding bit-tuples for the adjacent ranges 212 and 213 are respectively "01" and "00", and the corresponding bit-tuples for the adjacent ranges 213 and 214 are respectively "00" and "10". Using grey-coding, if a particular cell voltage drifts to an adjacent range, the error is typically limited to a single bit within the 2-bit bit-tuple. The probability that a particular cell voltage drifts beyond an adjacent range is typically small, for example less than one percent, if not negligible.

Preferably, during a write operation, the charge on the floating gate of the MLC would be set such that the resultant cell voltage is at the center of one of the ranges 211, 212, 213, 214 in order to write the corresponding bit-tuple to the MLC. In other words, ideally, the resultant cell voltage would be set to one of $V_{11}$ 211b, $V_{10}$ 212b, $V_{00}$ 213b and $V_{10}$ 214b in order to write a corresponding one of the bit-tuples "11", "01", "00" and "10." More typically, though, the resultant cell voltage is set to a value within a predefined range (e.g., 50, 100 or 200 millivolts) of a respective center voltage $V_{11}$ 211b, $V_{10}$ 212b, $V_{00}$ 213b and $V_{10}$ 214b corresponding to the bit-tuple written to the MLC.

Figure 2B:
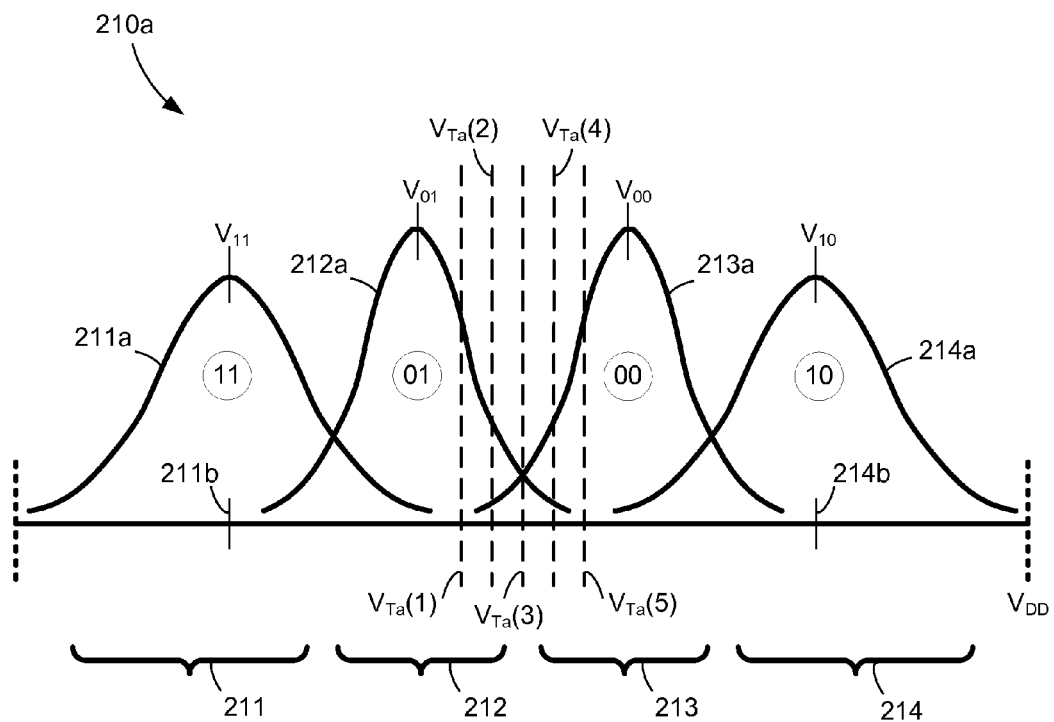
FIG. 2B is a prophetic diagram of voltage distributions that may be found in a multi-level flash memory cell (MLC) over time and a number of reading threshold voltages for a lower page read, in accordance with some embodiments.

As illustrated in FIG. 2B and as described throughout the present disclosure, the least significant bit (i.e., the right-most bit) of each bit-tuple corresponds to the "lower page" bit value of a MLC, and that the most significant bit (i.e., the left-most bit) of each bit-tuple corresponds to the "upper page" bit value of the MLC. However, those skilled in the art will appreciate that in other implementations the relative positions of the upper and lower page bits can be exchanged. Moreover, under typical operating conditions, however, due in part to the factors described above, the actual cell voltage may differ from the center voltage for the data written to the MLC.

With further reference to FIG. 2B, in some implementations, for a lower page read, reading threshold voltages $V_{Ta}(1)$, $V_{Ta}(2)$, $V_{Ta}(3)$, $V_{Ta}(4)$, $V_{Ta}(5)$ are applied between adjacent center voltages, e.g., applied proximate to the halfway region between adjacent center voltages $V_{01}$ 212b and $V_{00}$ 213b, and thus define threshold voltages between the voltage ranges 212, 213. In some implementations, reading threshold voltages $V_{Ta}(1)$, $V_{Ta}(2)$, $V_{Ta}(3)$, $V_{Ta}(4)$, $V_{Ta}(5)$ are applied in the region proximate to where the voltage distributions 212a, 213a overlap, which may not necessarily be proximate to the halfway region between adjacent center voltages $V_{01}$ 212b and $V_{00}$ 213b. In some implementations, during a lower page read operation, reading threshold voltages $V_{Ta}(1)$, $V_{Ta}(2)$, $V_{Ta}(3)$, $V_{Ta}(4)$, $V_{Ta}(5)$ are sequentially applied, such that the application of each reading threshold voltage yields a raw read data value. Thus, for reading threshold voltages $V_{Ta}(1)$, $V_{Ta}(2)$, $V_{Ta}(3)$, $V_{Ta}(4)$, $V_{Ta}(5)$ five separate raw lower page read data values are obtained for each memory location (i.e., MLC). Those skilled in the art will appreciate that any number of two or more reading threshold voltages can be used in various implementations, and that the five reading threshold voltages described with reference FIG. 2B are merely provided as an illustrative example. Moreover, those skilled in the art will also appreciate that an upper page read can be performed by applying one or more reading threshold voltages across the respective transition between voltage distributions 211a and 212a or the respective transition between voltage distributions 213a and 214a. However, for the sake of brevity, an example of such an upper page read is not described in exhaustive detail.

Figure 3:
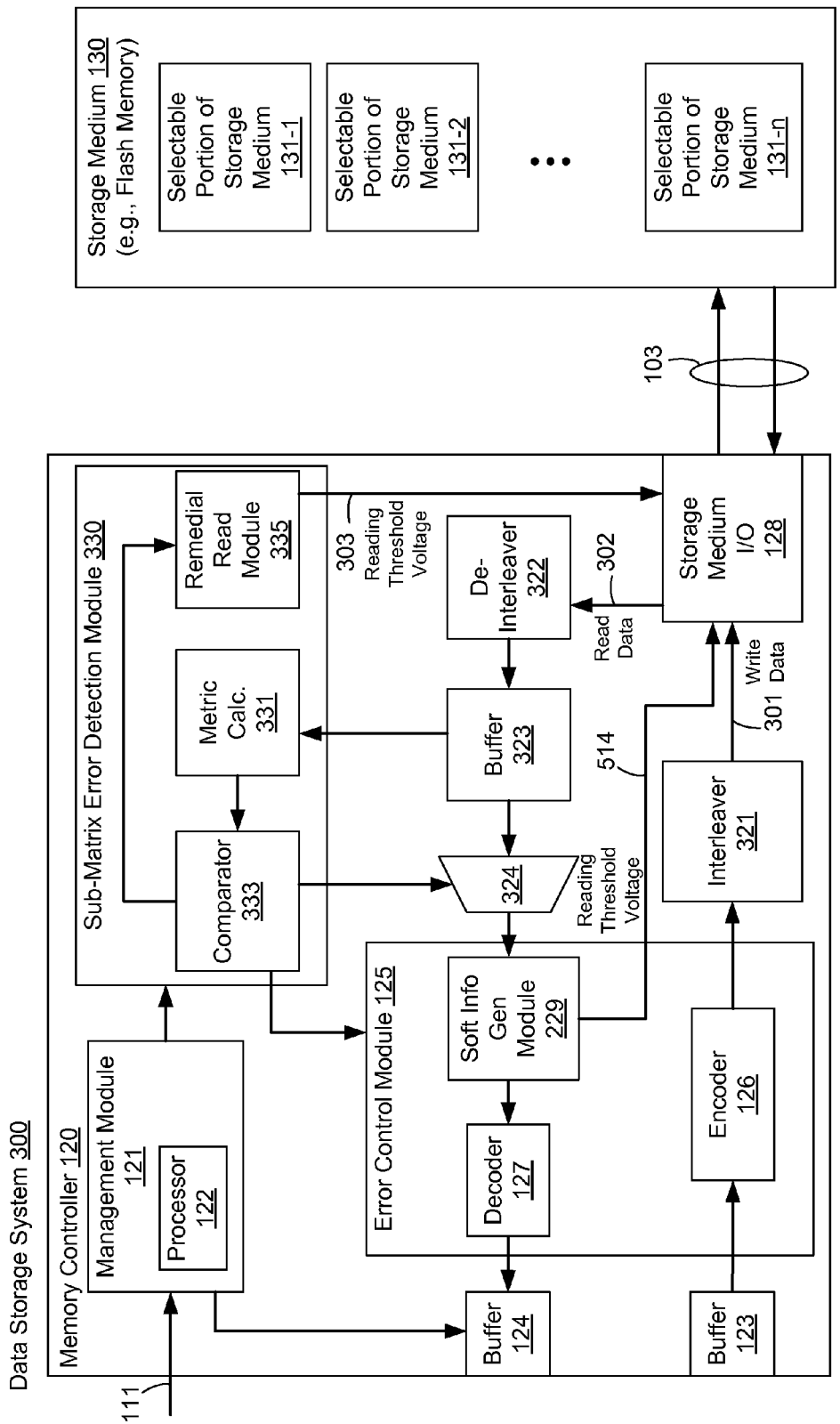
FIG. 3 is a diagram of a data storage system, including a sub-matrix error detection module, in accordance with some embodiments.

FIG. 3 is a diagram of a data storage system 300, including a sub-matrix error detection module 330, in accordance with some embodiments. Data storage system 300 illustrated in FIG. 3 is similar to and adapted from data storage system 100 illustrated in FIG. 1. Elements common to each include common reference numbers, and only the differences between FIGS. 1 and 3 are described herein for the sake of brevity. Moreover, while certain specific features are illustrated, various other features have not been illustrated for the sake of brevity and so as not to obscure more pertinent aspects of the example implementations disclosed herein.

With reference to FIG. 3, as a non-limiting example, storage medium 130 is configured to include two or more portions of memory 131-1, 131-2, ..., 131-n that are each individually selectable. In some implementations, the two or more portions of memory 131-1, 131-2, ..., 131-n are substantially independent from one another. Further, each of the two or more portions of memory 131-1, 131-2, ..., 131-n may be relatively more or less error-prone than the others. In some implementations, each of the two or more portions of memory 131-1, 131-2, ..., 131-n comprises a distinct set of one or more memory die, each having an array of memory cells. In some implementations, each of the two or more portions of memory 131-1, 131-2, ..., 131-n is a different chip, semiconductor die, memory array block, memory block sector, memory block or sector plane, page, or word line than the other memory portions 131-i.

Data storage system 300, and in particular, memory controller 120 has been further configured to reduce the risks associated with interleaving codewords across two or more portions of memory 131-1, 131-2, ..., 131-n. More specifically, memory controller 120 is configured to detect whether at least one of the memory portions 131 is more error-prone than the others. Memory controller 120 is also further configured to selectively employ various remedial operations in response to detecting an unbalanced error condition, in which at least one portion of memory is substantially more error prone than the others. To those ends, memory controller 120 includes sub-matrix error detection module 330, interleaver 321, de-interleaver 322, buffer 323, multiplexer (MUX) 324, and soft information generation module 229. As noted above, additionally and/or alternatively, those skilled in the art will appreciate from the present disclosure that one or more components included in memory controller 120 can be implemented as a suitable combination of hardware, software and firmware, and that software instructions in any one component and/or portion thereof are executable by the one or more processors 122 of management module 121.

In some implementations, encoder 126 is configured to encode data using a generator matrix G of an error control code, where the error control code is configured to have the capacity to permit error detection for individual portions of a codeword, in addition to the capacity to permit error detection for the entire codeword. To that end, as described in greater detail with reference to FIGS. 4A and 4B below, the error control code is configured so that a parity check matrix H of the error control code is modified to include two or more sub-matrices that can be used to detect errors in corresponding two or more portions of a codeword produced using a corresponding generator matrix G.

In some implementations, the error control code is a low density parity check (LDPC) code. Those skilled in the art will appreciate that LDPC codes are a family of linear codes that may be designed using a bipartite graph g, in which one column (or row) of nodes includes N variable nodes, and the other column (or row) includes m check nodes. The bipartite graph g generates a linear code of block length N and dimension of at least N−m as follows. The N coordinates of a codeword are associated with the N variable nodes. The codewords are those vectors $(c_1, \ldots, c_N)$ such that for all check nodes the sum of the neighboring positions among the message nodes is zero.

The bipartite graph g representation may be converted to a parity check matrix H as follows. The parity check matrix H is defined as a binary m×N matrix in which each entry (i, j) is 1 (or, more generally, a predefined value) if and only if the $i^{th}$ check node is connected to the $j^{th}$ variable node in the graph g. Equivalently, for binary data, the N columns of the parity check matrix H represent the N variable bits (i.e., the data bits or codeword bits), and the m rows of the matrix H represent the m check bits. Given the parity check matrix H, the LDPC code defined by the graph g is the set of vectors $c=(c_1, \ldots, c_N)$, such that $Hc^T=0$. The parity check matrix H and the corresponding generator matrix G of an error control code satisfy equation (1):

$$HG^T = 0 \quad (1)$$

where $G^T$ is the transpose of the generator matrix G, and the generator matrix is a k×N matrix. The generator matrix G is used to generate a N×1 codeword v from a k×1 data word (or message vector) x according to equation (2):

$$v = G^T x \quad (2)$$

Two examples of a LDPC parity check matrix H satisfying the aforementioned conditions, as well as the capacity to permit error detection for individual portions of a codeword v are described below with reference to FIGS. 4A and 4B. In some implementations, the codeword v is a low density parity check (LDPC) codeword.

Interleaver 321 is coupled between encoder 126 and storage medium I/O 128. Interleaver 321 is generally employed to normalize the distribution of errors throughout a codeword or a set of codewords so that the quantity and distribution of errors within one codeword falls within the error correcting capability of the ECC used to encode data into a set of one or more codewords v. For example, in some implementations, as a part of a write operation, interleaver 321 divides a codeword v into two or more portions $v_1, v_2, \ldots, v_n$, such that $v=[v_1, v_2, \ldots, v_n]$. In some implementations, each of the two or more portions $v_1, v_2, \ldots, v_n$ of a codeword v includes the same number of bits b. In such implementations, each of the two or more portions $v_1, v_2, \ldots, v_n$ of a codeword v is a b×1 matrix (or vector), where bn=N. In some other implementations, some of the two or more portions $v_1, v_2, \ldots, v_n$ of a codeword v have a different number of bits than the other codeword portions. Irrespective of the number of bits in each codeword portion, the summation of the bits from the two or more portions $v_1, v_2, \ldots, v_n$ of the codeword v is n, the bit-length of the codeword v. Interleaver 321 also assigns two or more portions $v_1, v_2, \ldots, v_n$ of the codeword v to two or more portions of memory 131-1, 131-2, . . . , 131-n, so that each memory portion stores a respective portion of the codeword v. Storage medium I/O 128 writes the distinct portions $v_1, v_2, \ldots, v_n$ of each codeword to corresponding distinct portions of memory 131-1, 131-2, . . . , 131-n.

Storage medium I/O 128 is also operable to read from two or more portions of memory 131-1, 131-2, . . . , 131-n. In some implementations, storage medium I/O 128 reads data from memory including one or more codewords in the set of codewords, each codeword of the one or more codewords read from memory including the aforementioned two or more portions $v_1, v_2, \ldots, v_n$ that are each read from a distinct portion of the two or more portions of memory 131-1, 131-2, . . . , 131-n. Each of the two or more portions $v_1, v_2, \ldots, v_n$ of a codeword may include errors caused by the error-inducing factors outlined above.

De-interleaver 322, buffer 323 and MUX 324 are coupled in series between the storage medium I/O 128 and the error control module 125. Additionally, soft information generation module 229 is coupled between MUX 324 and decoder 127. In some implementations, soft information generation module 229 is external to the error control module 125. De-interleaver 322 is coupled to receive raw read data on data line 302 from two or more portions of memory 131-1, 131-2, . . . , 131-n via storage medium I/O 128. The raw read data 302 includes a set of one or more codewords that have each been divided into a number of portions as described above. De-interleaver 322 is operable to reverse the interleaving (i.e., shuffling) of the encoder-side interleaver 321 so that the codewords are reassembled from the codeword portions retrieved from the two or more portions of memory 131-1, 131-2, . . . , 131-n. De-interleaver 322 writes the reassembled codewords into buffer 323, which is accessible both by the sub-matrix error detection module 330 and through the MUX 324.

In some implementations, sub-matrix error detection module 330 computes two or more error propensity metrics using a parity check matrix H configured to have the capacity to permit error detection for individual portions $v_1, v_2, \ldots, v_n$ of a codeword v, in addition to the capacity to permit error detection for the entire codeword v. To that end, in some implementations, sub-matrix error detection module 330 includes an error propensity metric calculator 331, a comparator 333, and a remedial read module 335.

Briefly, in some implementations, error propensity metric calculator 331 computes two or more error propensity metrics. Each error propensity metric corresponding to a respective one of the two or more portions of memory 131-1, 131-2, . . . , 131-n. Each error propensity metric is computed using a corresponding sub-matrix $H_1, H_2, \ldots, H_n$ of the parity check matrix H and the respective portions $v_1, v_2, \ldots, v_n$ of the one or more codewords read from the corresponding portion 131-1, 131-2, . . . , 131-n of memory. Comparator 333 determines and/or identifies a respective error propensity metric, of the two or more error propensity metrics, that satisfies remedial correction criteria. In some implementations, the remedial correction criteria include a criterion that the respective error propensity metric is outside a threshold range. In some implementations, determining and/or identifying a respective error propensity metric is indicative of an unbalance error condition, in which at least one of the two or more portions of memory is more or less error-prone than the others. In response to determining and/or identifying a respective error propensity metric, comparator 333 selectively initiates at least one remedial operation involving remedial read module 335 or soft information generation module 229. For example, in some implementations, comparator 333 signals remedial read module 335 to provide storage medium I/O 128 an adjusted reading signal value (e.g. reading threshold voltage 303) for use when re-reading from a portion of the memory corresponding to the identified error propensity metric. In some implementations, comparator 333 signals soft information generation module 229 to adjust soft information values (e.g. LLRs) associated with one or more of the portions of memory based on the detection of an unbalanced error condition determined from the two or more error propensity metrics. On the other hand, in response to not determining and/or identifying an error propensity metric satisfying the remedial correction criteria, comparator 333 provides a control signal to MUX 324 that allows error control module 125 to access codewords in buffer 323. In turn, soft information generation module 229 generates soft information values for each of the codewords in buffer 323, which is described in greater detail below with reference to FIG. 5.

More specifically, in some implementations, the two or more error propensity metrics are computed as follows. For each codeword v read from memory a m×1 syndrome matrix s can be calculated according to equation (3):

$$s = Hv \quad (3)$$

In some implementations, when the parity check matrix H has been configured to include two or more sub-matrices $H_1$, $H_2, \ldots, H_n$, sub-syndrome matrices $s_1, s_2, \ldots, s_n$ are calculated according to equation (4):

$$s_i = H_i v_i \quad (4)$$

where the syndrome weight of each sub-syndrome matrix $s_1$, $s_2, \ldots, s_n$ provides an estimate of the number of errors in the respective one of the two or more portions $v_1, v_2, \ldots, v_n$ of codeword v, and in turn an estimate of the error propensity of a respective one of the two or more portions of memory 131-1, 131-2, ..., 131-n. In some implementations, computing the two or more error propensity metrics includes computing two or more sub-syndrome matrices $s_1, s_2, \ldots, s_n$, where each sub-syndrome matrix $s_1, s_2, \ldots, s_n$ is a function of a corresponding one of the two or more portions $v_1$, $v_2, \ldots, v_n$ of the codeword and a corresponding one of the two or more sub-matrices $H_1, H_2, \ldots, H_n$.

Additionally, in some implementations, the two or more sub-syndrome matrices $s_1, s_2, \ldots, s_n$ are used to estimate two or more probability values $q_1, q_2, \ldots, q_n$ associated with two or more portions of memory 131-1, 131-2, ..., 131-n. Each probability value $q_i$ is indicative of the probability that a bit in a sub-syndrome matrix $s_i$ is a first predefined value, where the first predefined value indicates the presence of an error in the corresponding codeword portion $v_i$. In some implementations, the first predefined value is a "1." In some implementations, probability value $q_i$ is estimated by dividing the number of "1's" in $s_i$ by the number of rows $L_i$ in sub-matrix $H_i$. In some implementations, computing the two or more error propensity metrics includes computing two or more probability values $q_1, q_2, \ldots, q_n$, where each probability value $q_i$ is representative of a likelihood that an element of a corresponding one of the two or more sub-syndrome matrices has a first predefined value. In some implementations, each probability value $q_1, q_2, \ldots, q_n$ is a function of a dividend value indicative of a summation of elements, in a corresponding one of the two or more sub-syndrome matrices $s_1, s_2, \ldots, s_n$, that have a first predefined value, and a divisor value corresponding to the number of rows $L_1, L_2, \ldots, L_n$ in a corresponding one of the two or more first sub-matrices $H_1, H_2, \ldots, H_n$.

Additionally, in some implementations, the two or more probability values $q_1, q_2, \ldots, q_n$ are used to estimate two or more bit error rate values $p_1, p_2, \ldots, p_n$ for the corresponding two or more portions of memory 131-1, 131-2, ..., 131-n. In some implementations, a bit error rate value $p_i$ is estimated from a corresponding probability value $q_i$ according to equation (5):

$$p_i = (1-(1-2q_i)^{1/W_i})/2 \quad (5)$$

where $W_i$ is the row weight of sub-matrix $H_i$. Assuming that the bit error rate is substantially smaller than 1.0 (i.e., $p_i \ll 1$), equation (5) can be estimated by equation (6):

$$p_i = q_i/W_i$$

In some implementations, computing the two or more error propensity metrics includes computing two or more bit error rate values $p_1, p_2, \ldots, p_n$, where each bit error rate value $p_1$, $p_2, \ldots, p_n$ is a function of a corresponding one of the two or more probability values $q_1, q_2, \ldots, q_n$ and a respective row weight $W_1, W_2, \ldots, W_n$ associated with a corresponding one of the two or more first sub-matrices $H_1, H_2, \ldots, H_n$. In some implementations, computing the two or more error propensity metrics includes retrieving two or more bit error rate ranges $p_1, p_2, \ldots, p_n$, wherein each bit error rate range is associated with a corresponding one of the two or more sub-syndrome matrices $s_1, s_2, \ldots, s_n$.

Figure 3A:
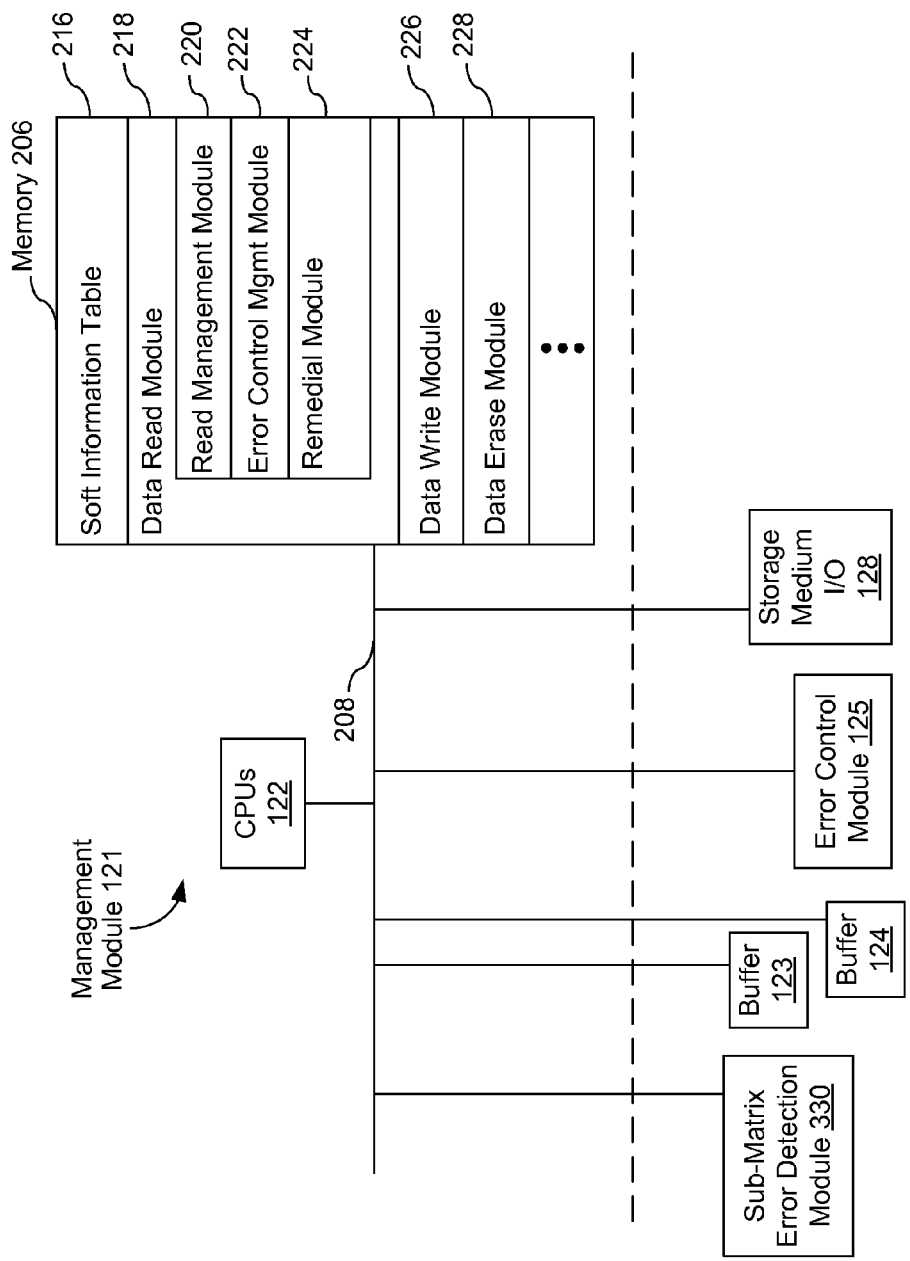
FIG. 3A is a block diagram illustrating an exemplary management module 121, in accordance with some embodiments.

FIG. 3A is a block diagram illustrating an exemplary management module 121, in accordance with some embodiments. Management module 121 typically includes one or more processing units (CPUs) 122 for executing modules, programs and/or instructions stored in memory 206 and thereby performing processing operations, memory 206, and one or more communication buses 208 for interconnecting these components. Communication buses 208 optionally include circuitry (sometimes called a chipset) that interconnects and controls communications between system components. Management module 121 is coupled to buffer 123, buffer 124, error control module 125, storage medium I/O 128, and sub-matrix error detection module 330 by communication buses 208. Memory 206 includes high-speed random access memory, such as DRAM, SRAM, DDR RAM or other random access solid state memory devices, and may include non-volatile memory, such as one or more magnetic disk storage devices, optical disk storage devices, flash memory devices, or other non-volatile solid state storage devices. Memory 206 optionally includes one or more storage devices remotely located from the CPU(s) 122. Memory 206, or alternately the non-volatile memory device(s) within memory 206, comprises a non-transitory computer readable storage medium. In some embodiments, memory 206, or the computer readable storage medium of memory 206 stores the following programs, modules, and data structures, or a subset thereof:

- a soft information table 216 that includes a table of soft information values used for decoding data read from a storage medium;
- a data read module 218 that is used for reading data from a storage medium;
- a data write module 226 that is used for writing data to a storage medium; and
- a data erase module 228 that is used for erasing data from a storage medium.

In some embodiments, the data read module 218 optionally includes the following modules or sub-modules, or a subset thereof:

a read management module 220 that is used for controlling or managing execution of read commands received from a host device such as computer system 110 (FIG. 1);

an error control management module 222 that is used to receive error indicators (e.g., syndrome weights) from error control module 125, and optionally to control operation of error control module 125; and a remedial module 224 that determines and/or identifies a respective error propensity metric in conjunction with comparator 333 and selectively initiates at least one remedial operation involving one of remedial read module 335 and soft information generation module 229.

Each of the above identified elements may be stored in one or more of the previously mentioned memory devices, and corresponds to a set of instructions for performing a function described above. The above identified modules or programs (i.e., sets of instructions) need not be implemented as separate software programs, procedures or modules, and thus various subsets of these modules may be combined or otherwise re-arranged in various embodiments. In some embodiments, memory 206 may store a subset of the modules and data structures identified above. Furthermore, memory 206 may store additional modules and data structures not described above. In some embodiments, the programs, modules, and data structures stored in memory 206, or the computer readable storage medium of memory 206, provide instructions for implementing any of the methods described below with reference to FIGS. 6 and 7.

Although FIG. 3A shows a management module 121, FIG. 3A is intended more as functional description of the various features which may be present in a management module than as a structural schematic of the embodiments described herein. In practice, and as recognized by those of ordinary skill in the art, items shown separately could be combined and some items could be separated.

Figure 4A:
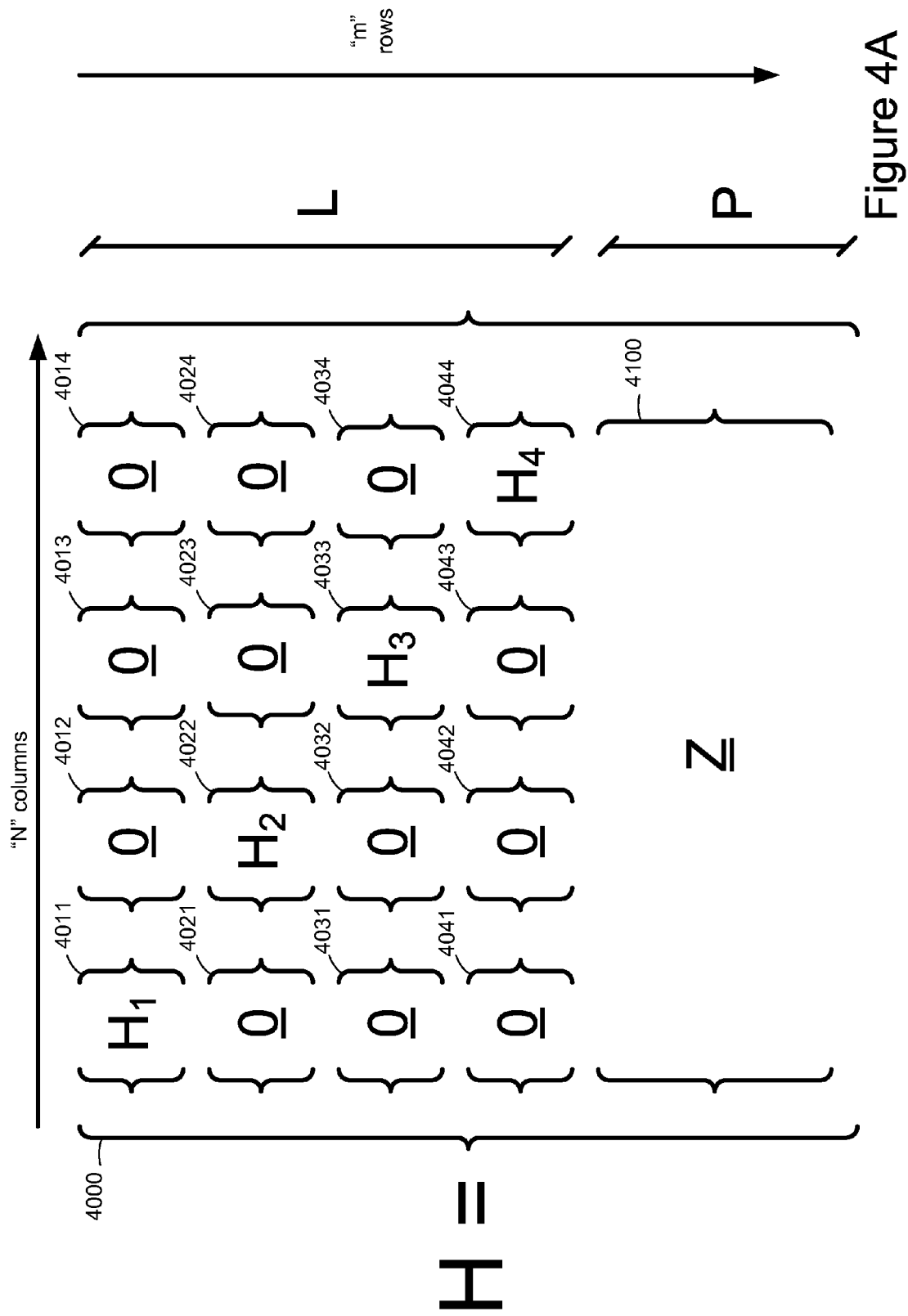
FIG. 4A is a schematic diagram of an example implementation of a parity check matrix for a low density parity check (LDPC) code configured to enable sub-matrix error detection for portions of an entire codeword.

FIG. 4A is a schematic diagram of an example implementation of a parity check matrix H 4000 for a low density parity check (LDPC) code configured to enable sub-matrix error detection for portions of an entire codeword. Parity check matrix H 4000 includes four sub-matrices $H_1$ 4011, $H_2$ 4022, $H_3$ 4033, $H_4$ 4044 arranged to permit error detection in four individual portions of an associated codeword, in addition to the capacity to permit error detection for the entire codeword. While four sub-matrices are included in the schematically illustrated parity check matrix, those skilled in the art will appreciate that a fewer or a greater number of sub-matrices can be included in a parity check matrix in other implementations.

Each of the four sub-matrices $H_1$ 4011, $H_2$ 4022, $H_3$ 4033, $H_4$ 4044 has a respective number of rows $L_1$, $L_2$, $L_3$, $L_4$, corresponding to the number of check bits associated with each sub-matrix. The total number of rows L included in the four sub-matrices $H_1$ 4011, $H_2$ 4022, $H_3$ 4033, $H_4$ 4044 is the summation of $L_1$, $L_2$, $L_3$, $L_4$ (i.e., $L=L_1+L_2+L_3+L_4$). As such, the four sub-matrices $H_1$ 4011, $H_2$ 4022, $H_3$ 4033, $H_4$ 4044 account for L of the m check bits of the parity check matrix H 4000. In some implementations, the parity check matrix H 4000 also includes at least one other sub-matrix Z 4100 that is not necessarily associated with just one portion of a codeword. The at least one other sub-matrix Z 4100 has P rows, which account for the remaining m check bits.

Each of the four sub-matrices $H_1$ 4011, $H_2$ 4022, $H_3$ 4033, $H_4$ 4044 is isolated from the others by a number of zero matrices. The zero matrices "prevent" the check bits in each of the four sub-matrices $H_1$ 4011, $H_2$ 4022, $H_3$ 4033, $H_4$ 4044 from overlapping with check bits in the others. In other words, each of the four sub-matrices $H_1$ 4011, $H_2$ 4022, $H_3$ 4033, $H_4$ 4044 occupy a respective set of rows and a respective set of columns that the others do not. Accordingly, each of the four sub-matrices $H_1$ 4011, $H_2$ 4022, $H_3$ 4033, $H_4$ 4044 permits error detection in a respective individual portion of a codeword independent of the others. To that end, as shown in FIG. 4A, sub-matrix $H_1$ 4011 is included in a row of zero matrices 4012, 4013, 4014. Similarly, sub-matrix $H_2$ 4022 is included in a row of zero matrices 4021, 4023, 4024. Similarly, sub-matrix $H_3$ 4011 is included in a row of zero matrices 4031, 4032, 4034. Similarly, sub-matrix $H_4$ 4011 is included in a row of zero matrices 4041, 4042, 4043.

Figure 4B:
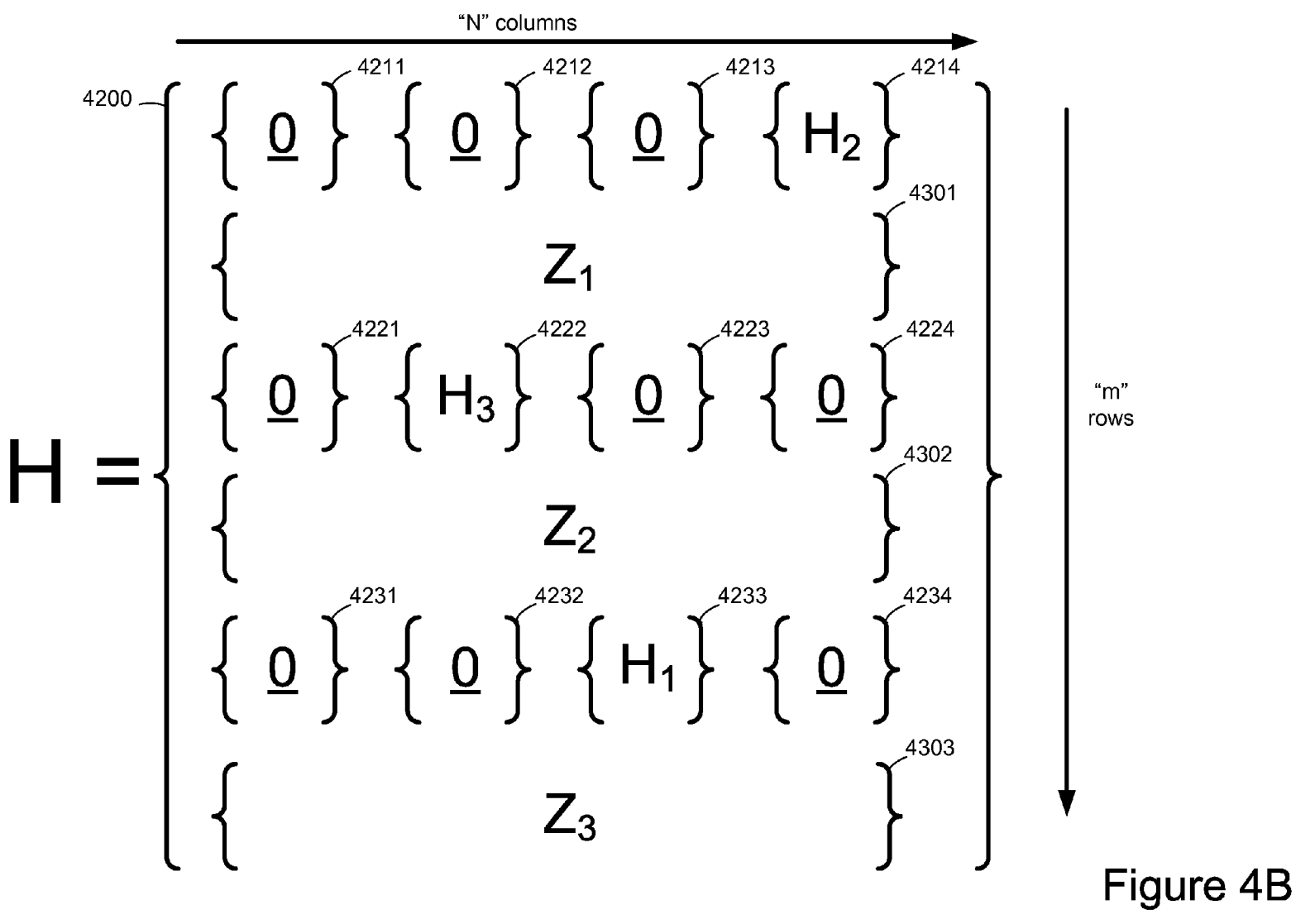

FIG. 4B is a schematic diagram of another example implementation of a parity check matrix H 4200 for a low density parity check (LDPC) code configured to enable sub-matrix error detection for portions of an entire codeword, in accordance with some implementations. Parity check matrix H 4200 illustrated in FIG. 4B is similar to and adapted from parity check matrix H 4000 illustrated in FIG. 4A, and only the differences between FIGS. 4A and 4B are described herein for the sake of brevity. To that end, parity check matrix H 4200 includes three sub-matrices $H_1$ 4233, $H_2$ 4214, $H_3$ 4222 interspersed amongst three other sub-matrices $Z_1$ 4301, $Z_2$ 4302, $Z_3$ 4303. The check bits included in each of the three sub-matrices $H_1$ 4233, $H_2$ 4214, $H_3$ 4222 are independent of the check bits in the other two of the three sub-matrices $H_1$ 4233, $H_2$ 4214, $H_3$ 4222. In other words, each of the three sub-matrices $H_1$ 4233, $H_2$ 4214, $H_3$ 4222 occupy a respective set of rows and a respective set of columns that the others do not. However, the check bits included in the three sub-matrices $H_1$ 4233, $H_2$ 4214, $H_3$ 4222 are not necessarily independent of the check bits included in the three other sub-matrices $Z_1$ 4301, $Z_2$ 4302, $Z_3$ 4303. As described above, isolation between each of the three sub-matrices $H_1$ 4233, $H_2$ 4214, $H_3$ 4222 is achieved using a number of zero matrices. To that end, sub-matrix $H_1$ 4233 is included in a row of zero matrices 4231, 4232, 4234. Similarly, sub-matrix $H_2$ 4214 is included in a row of zero matrices 4211, 4212, 4213. Similarly, sub-matrix $H_3$ 4222 is included in a row of zero matrices 4221, 4223, 4224.

In some implementations, error detection enabled by sub-syndrome matrix calculations described herein is sub-optimal for LDPC codes at least when the parity check matrix H includes rows that are not included in any of the two or more sub-matrices $H_1$, $H_2$, ..., $H_n$, as shown in the examples illustrated in FIGS. 4A and 4B. Each of the two or more sub-matrices $H_1$, $H_2$, ..., $H_n$ defines less than the total number of interconnections between a check node and a number of message nodes of the code as compared to the parity check matrix H as a whole. As such, error detection using the whole parity check matrix H is likely to result in the detection of errors that would not be detected by the two or more sub-matrices $H_1$, $H_2$, ..., $H_n$ included in the parity check matrix H. Therefore, in some implementations, each of the two or more sub-matrices $H_1$, $H_2$, ..., $H_n$ includes a sub-optimal parity check matrix within the parity check matrix H associated with the whole codeword.

Figure 5:
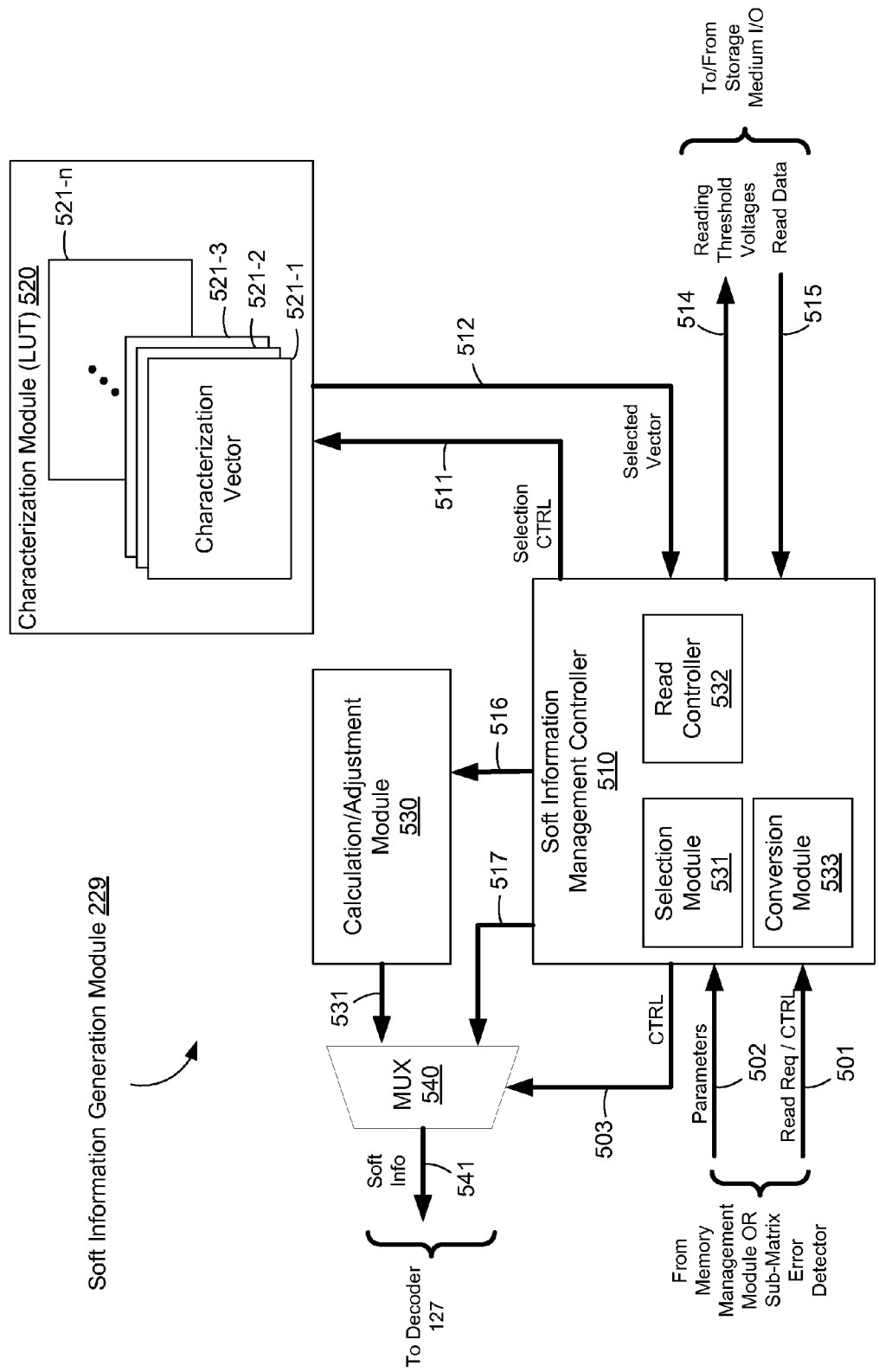
FIG. 5 is a diagram of an implementation of the soft information generation module included in FIG. 3, in accordance with some embodiments.

FIG. 5 is a diagram of an implementation of the soft information generation module 229 included in FIG. 3. Again, as noted above, while certain specific features are illustrated, various other features have not been illustrated for the sake of brevity and so as not to obscure more pertinent aspects of the example implementations disclosed herein. To that end, as a non-limiting example, the soft information generation module 229 includes a soft information management controller 510, a characterization module 520, a calculation/adjustment module 530, and an output multiplexer (MUX) 540. As shown in FIG. 3, soft information generation module 229 is coupled to decoder 127, memory management module 120 and storage medium I/O 128 through buffer 323 and multiplexer 324.

The soft information management controller 510 is coupled to each of the characterization module 520, calculation/adjustment module 530, and MUX 540 in order to coordinate the operation of soft information generation module 229. More specifically, in some implementations, soft information management controller 510 is connected to receive a read request and one or more storage medium characterization parameters on control and data lines 501 and 502, respectively. Soft information management controller 510 is also connected to provide characterization module 520 a selection control signal on control line 511, and to receive a selected characterization vector on data line 512. In some implementations, soft information management controller 510 is further connected to provide reading threshold voltages to the storage medium I/O 128 via data line 514, and receive raw read data from the storage medium I/O 128 on data line 515 by way of buffer 323 and multiplexer 324. Soft information management controller 510 is also connected to provide sequences of soft information values to the calculation/adjustment module 530 and output MUX 540 via corresponding data lines 516 and 517, and a control signal to output MUX 540 via control line 503. Output MUX 540 is also connected to receive adjusted soft information values from calculation/adjustment module 530 on data line 531. Output MUX 540 is connected to selectively provide soft information values from one of conversion module 533 and calculation/adjustment module 530 on data line 541 depending on the control signal received on control line 503.

Characterization module 520 includes a collection of characterization vectors 521-1, 521-2, 521-3, . . . 521-$n$, that each store characterization data, such as soft information values for bit-tuples and reading threshold voltages, associated with storage medium 130 for one or more storage medium characterization parameter values. In some implementations, the characterization data stored in the characterization vectors 521 is statistically derived. Each combination of storage medium characterization parameter values represents a respective state of a storage medium that may be characterized in a device characterization process, and may exist for other devices produced by the same manufacturing process.

Soft information management controller 510 includes a selection module 531, an optional read controller 532, and a conversion module 533. Selection module 531 is configured to use the one or more storage medium characterization parameters values to select a characterization vector from the stored collection of characterization vectors 521-1, 521-2, 521-3, . . . 521-$n$ in accordance with the current state of storage medium 130. In some implementations, the selection control signal includes one or more of storage medium characterization parameters values and/or an index key associated with a combination of one or more of storage medium characterization parameters values that enables characterization module 520 to select a characterization vector based on the one or more storage medium characterization parameters values associated with the current state of the storage medium 130.

Optional read controller 532 is configured to read a portion of the storage medium 130 via storage medium I/O 128. In some implementations, read controller 532 is configured to provide storage medium I/O 128 with reading threshold voltages (e.g., digital values representing one or more reading threshold voltages) for the read operation. In some implementations, read controller 532 selects one or more statistically determined reading threshold voltages from a characterization vector selected based on the one or more storage medium characterization parameter values associated with the current state of storage medium 130.

Conversion module 533 is configured to generate a sequence of soft information values corresponding to raw hard-decision read data. The sequence of soft information values is generated, at least in part, by selecting a respective soft information value from the selected characterization vector for each bit-tuple of the raw hard-decision read data produced by a read operation using a corresponding reading threshold voltage value. More specifically, in some implementations, the conversion module 533 assigns at least one soft information value, in the form of a LLR, to each bit-tuple in the hard-decision read data to produce a corresponding sequence of LLRs $y_{LLR}=(y_1, y_2, \ldots, y_N)$, where N is the codeword length.

Calculation/adjustment module 430 is configured to adjust soft information values in response to detecting an unbalanced error condition in the two or more portions of memory 131-1, 131-2, . . . , 131-$n$. For example, in some implementations, independent of adjusting reading signal levels, a remedial operation includes adjusting the soft information values for at least some of the two or more portions of memory 131-1, 131-2, . . . , 131-$n$ based on the sub-syndrome matrices $s_1, s_2, \ldots, s_n$. In some implementations, the soft information values are adjusted based on the respective and pertinent weights (sometimes called syndrome weights) of the sub-syndrome matrices $s_1, s_2, \ldots, s_n$. In some embodiments, the syndrome weight for a respective portion of memory 131 indicates the number of bit errors detected (e.g., the number of non-zero syndromes, for the respective portion of memory 131) in a given iteration of the decoding process.

In some embodiments, adjusting the soft information values for a respective portion of memory 131 includes applying a predefined mathematical function to the soft information values to obtain the adjusted set of one or more soft information values. For example, in some implementations, a predefined mathematical function includes addition. As another example, in some implementations, the predefined mathematical function includes subtraction. As yet another example, in some implementations, the predefined mathematical function includes multiplication. In still other examples, in some implementations, the predefined mathematical function includes any number of mathematical functions. In some embodiments, the magnitude and/or manner of adjustment to the first set of one or more soft information values is based on the first indicator, which is based at least in part on the syndrome weight.

In some embodiments, the predefined mathematical function adds a predefined vector of values to a first set of one or more soft information values for a respective portion of memory 131 to obtain the second set of one or more soft information values. For example, given a first set of one or more soft information values (e.g., [−7, −2, +2, +7]), the predefined mathematical function adds a predefined vector of values (e.g., [+1, +1, −1, −1]) to the first set of one or more soft information values to obtain a second set of one or more soft information values (e.g., [−6, −1, +1, +6]). As another example, given a first set of one or more soft information values (e.g., [−7, −2, +2, +7]), the predefined mathematical function adds a predefined vector of values (e.g., [+4, +2, −2, −4]) to the first set of one or more soft information values to obtain a second set of one or more soft information values (e.g., [−3, 0, 0, +3]). In some embodiments, adding a predefined vector of values includes the function of subtracting, since the vector of values can include negative numbers.

In some implementations, a remedial operation includes adjusting the soft information values without any attendant adjustments to the reading signal levels. In some implementations, a remedial operation includes adjusting the soft information values independently of any attendant adjustments to the reading signal levels. In some implementations, a remedial operation includes adjusting the soft information values in coordination with any attendant adjustments to the reading signal levels.

Figure 6:
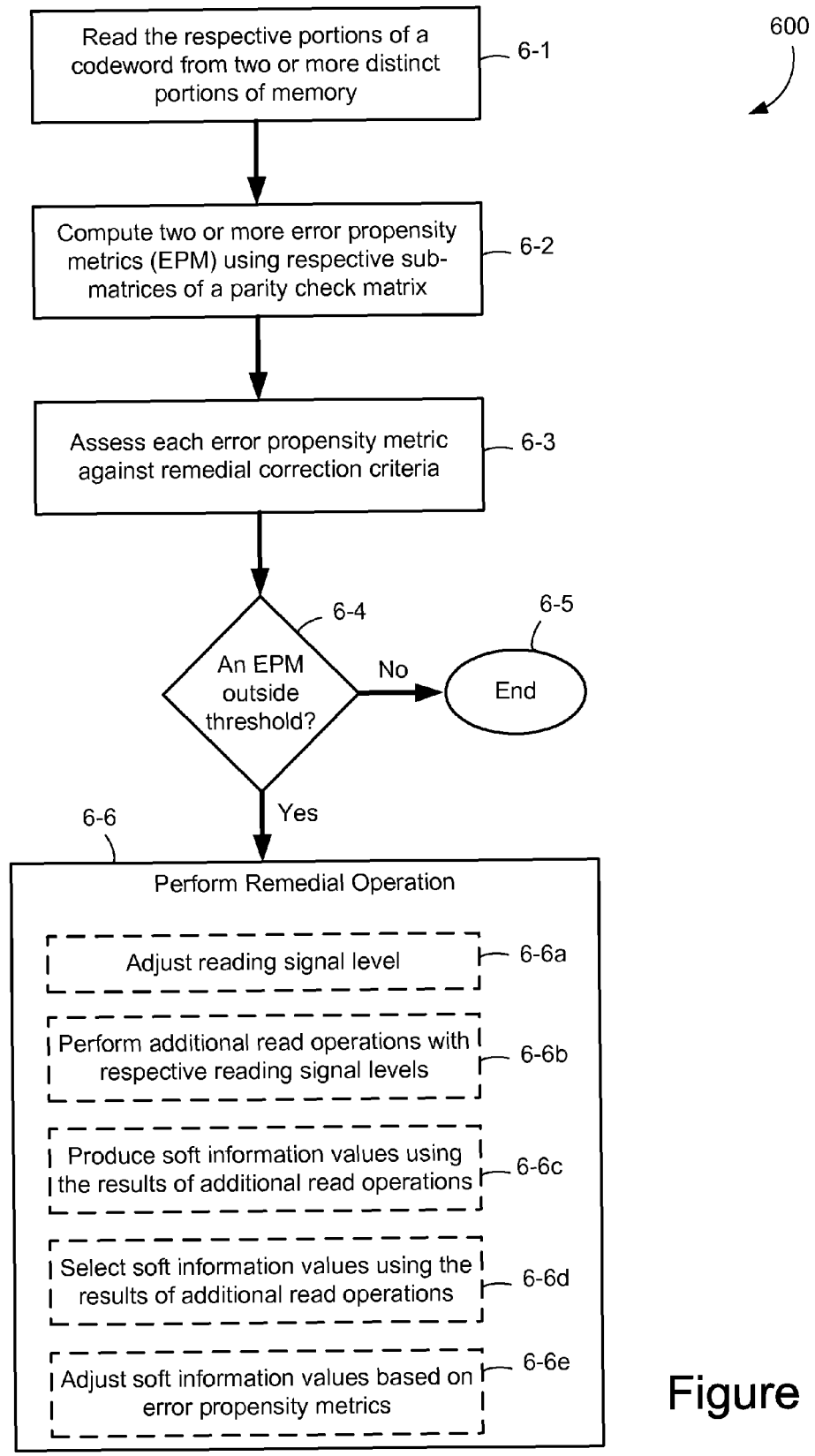
FIG. 6 is a flowchart representation of an implementation of a method of sub-matrix error detection and remedial operation based on sub-matrix error detection, in accordance with some embodiments.

FIG. 6 is a flowchart representation of an implementation of a method 600 of sub-optimal error detection and remedial operation based on the sub-optimal error detection. In some implementations, method 600 is performed by a memory controller or a module associated with a memory controller, such as sub-matrix error detection module 330 (shown in FIG. 3). Briefly, method 600 includes reading respective portions of codewords from two or more portions of memory, computing two or more error propensity metrics associated with the two or more portions of memory, and determining whether to perform a remedial operation based on the two or more error propensity metrics.

To that end, as represented by block 6-1, method 600 includes reading data from memory including one or more codewords in the set of codewords, each codeword of the one or more codewords read from memory including two or more portions that are each read from a distinct portion of the two or more portions of memory. For example, with reference to FIG. 3, storage medium I/O 128 reads two or more portions $v_1, v_2, \ldots, v_n$ of each codeword from two or more portions of memory 131-1, 131-2, ..., 131-n.

As represented by block 6-2, method 600 includes computing two or more error propensity metrics, each error propensity metric corresponding to a respective portion of memory, wherein each error propensity metric is computed using a corresponding sub-matrix of a parity check matrix associated with the set of codewords and the respective portions of the one or more codewords read from the corresponding portion of memory. In some implementations, each of the error propensity metrics is associated is a respective memory portion 131 and is: a syndrome weight obtained during a given iteration of the decoding process (e.g., a syndrome weight determined prior to performing a first iteration, or the syndrome weight determined during or at the conclusion of the first iteration of the decoding process), a sub-syndrome matrix $s_1, s_2, \ldots,$ or $s_n$; a probability value $q_1, q_2, \ldots,$ or $q_n$; or a bit error rate value $p_1, p_2, \ldots,$ or $p_n$.

As represented by block 6-3, method 600 includes assessing each of the two or more error propensity metrics against remedial correction criteria. In some implementations, assessing each of the two or more error propensity metrics includes determining whether a respective error propensity metric, of the two or more error propensity metrics, satisfies remedial correction criteria, the remedial correction criteria including a criterion that the respective error propensity metric is outside a threshold range. In some implementations, assessing each of the two or more error propensity metrics includes identifying a respective error propensity metric, of the two or more error propensity metrics, that satisfies remedial correction criteria, the remedial correction criteria including a criterion that the identified respective error propensity metric is outside a range associated with one or more other error propensity metrics of the two or more error propensity metrics. In the latter implementations, the identified respective error propensity metric is sometimes called an outlier, as it falls outside the range of error propensity metrics of the other error propensity metrics.

For example, with further reference to FIG. 3, while it is expected that each of the two or more portions of memory 131-1, 131-2, ..., 131-n will introduce respective errors in the two or more portions $v_1, v_2, \ldots, v_n$ of the codeword v, the remedial correction criteria are configured to determine and/or identify whether at least one of the two or more portions $v_1, v_2, \ldots, v_n$ of the codeword v has a threshold number of errors more than the others. In other words, the remedial correction criteria are configured to identify outliers that have significantly worse error performance indicative of an unbalanced error condition. As such, as represented by block 6-4, method 600 includes determining whether at least one of the error propensity metrics is outside a threshold range. If none of the error propensity metrics are outside the threshold range ("No" path from block 6-4), as represented by block 6-5, method 600 ends. With further reference to FIG. 3, when method 600 ends, comparator 333 signals MUX 324 to permit the transfer of the codewords in buffer 323 to soft information generation module 229.

On the other hand, if at least one of the error propensity metrics is outside a threshold range ("Yes" path from block 6-4), as represented by block 6-6, method 600 includes selectively performing at least one of various remedial operations to compensate and/or correct the unbalanced error condition represented by the breach of the threshold range.

As represented by block 6-6a, in some implementations, a remedial operation includes adjusting a reading signal level (e.g., reading threshold voltage) used to read the corresponding one of the two or more portions of memory. For example, with further reference to FIG. 3, comparator 333 signals remedial read module 335 to provide an adjusted reading threshold voltage on data line 303 to storage medium I/O 128. The adjusted reading threshold voltage is used to re-read at least the corresponding one of the two or more portions of memory 131-1, 131-2, ..., 131-n associated with the error propensity metric outside the threshold range.

As represented by block 6-6b, in some implementations, a remedial operation includes performing one or more additional read operations of the corresponding one of the two or more portions of memory using one or more adjusted (or additional) reading signal levels. For example, in some implementations, as noted above, at least the corresponding one of the two or more portions of memory 131-1, 131-2, ..., 131-n associated with the error propensity metric outside the threshold range is read. In some implementations, each of the two or more portions of memory 131-1, 131-2, ..., 131-n is re-read, including the portion(s) associated with the error propensity metric(s) outside the threshold range. However, in some implementations, only the portion(s) associated with the error propensity metric(s) outside the threshold range are re-read with adjusted reading threshold voltages. As represented by block 6-6c, in some implementations, a remedial operation includes producing a soft information value using the results of the one or more additional read operations.

As represented by block 6-6d, in some implementations, a remedial operation includes selecting soft information values from a characterization vector based on one or more characterization parameter values associated with a current state of the corresponding one of the two or more portions of memory, as described above with reference to FIG. 5. As represented by block 6-6e, in some implementations, a remedial operation includes adjusting the selected soft information values based on the error propensity metric identified as outside the threshold range, as described above with reference to FIG. 5.

Figure 7:
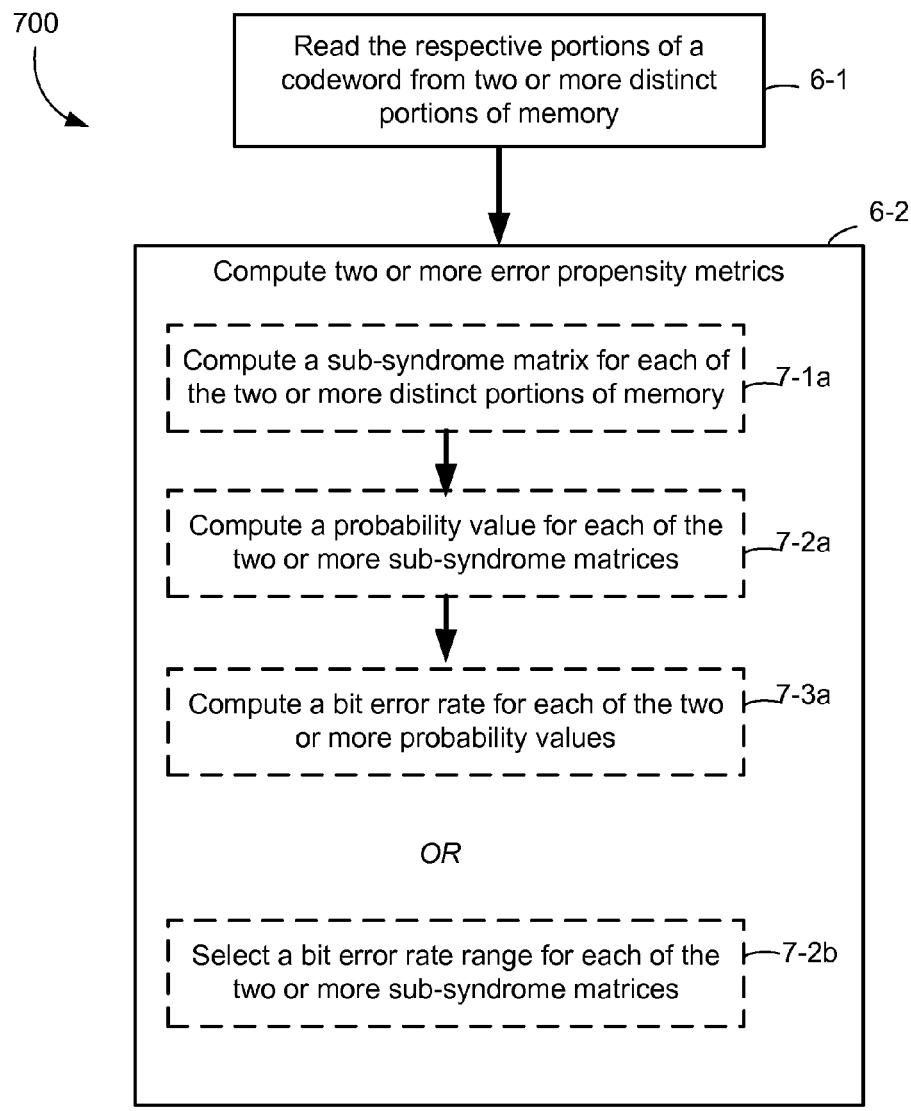
FIG. 7 is a flowchart representation of an implementation of a method of determining two or more error propensity metrics, each error propensity metric corresponding to a respective portion of memory, in accordance with some embodiments.

FIG. 7 is a flowchart representation of an implementation of a method 700 of determining two or more error propensity metrics, each error propensity metric corresponding to a respective portion of memory. In some implementations, method 700 is performed by a memory controller or a module associated with a memory controller, such as metric calculation module 331. Briefly, method 700 includes sequentially computing two or more sub-syndrome matrices $s_1, s_2, \ldots, s_n$, two or more probability values $q_1, q_2, \ldots, q_n$, and two or more bit error rate values $p_1, p_2, \ldots, p_n$—each type of error propensity metric respectively associated with two or more portions of memory 131-1, 131-2, ..., 131-n.

To that end, as represented by block 7-1a, method 700 includes computing two or more error propensity metrics by computing two or more sub-syndrome matrices $s_1, s_2, \ldots, s_n$, where each sub-syndrome matrix $s_1, s_2, \ldots, s_n$ is a function of a corresponding one of the two or more portions $v_1, v_2, \ldots, v_n$ of the codeword and a corresponding one of the two or more sub-matrices $H_1, H_2, \ldots, H_n$. As represented by block 7-2a, method 700 includes computing the two or more error propensity metrics by computing two or more probability values $q_1, q_2, \ldots, q_n$, where each probability value $q_i$ is representative of a likelihood that an element of a corresponding one of the two or more sub-syndrome matrices has a first predefined value. As noted above, in some implementations, each probability value $q_1, q_2, \ldots, q_n$ is a function of a dividend value indicative of a summation of elements, in a corresponding one of the two or more sub-syndrome matrices $s_1, s_2, \ldots, s_n$, that have a first predefined value, and a divisor value corresponding to the number of rows $L_1, L_2, \ldots, L_n$ in a corresponding one of the two or more first sub-matrices $H_1, H_2, \ldots, H_n$. As represented by block 7-3a, method 700 includes computing the two or more error propensity metrics by computing two or more bit error rate values $p_1, p_2, \ldots, p_n$, where each bit error rate value $p_1, p_2, \ldots, p_n$ is a function of a corresponding one of the two or more probability values $q_1, q_2, \ldots, q_n$ and a respective weight $W_1, W_2, \ldots, W_n$ associated with a corresponding one of the two or more first sub-matrices $H_1, H_2, \ldots, H_n$. In some implementations, computing the two or more error propensity metrics includes retrieving two or more bit error rate ranges $p_1, p_2, \ldots, p_n$, wherein each bit error rate range is associated with a corresponding one of the two or more sub-syndrome matrices $s_1, s_2, \ldots, s_n$. Additionally and/or alternatively, as represented by block 7-2b, method 700 includes selecting a bit error rate range for each of the two or more sub-syndrome matrices $s_1, s_2, \ldots, s_n$. In some implementations, bit error rate ranges are stored in a characterization vector associated with the current state of storage medium 130, as discussed above with reference to FIG. 5. As such, in some implementations, retrieving the two or more bit error rate ranges includes selecting a characterization vector based on one or more characterization parameter values associated with a current state of the corresponding one of the two or more portions of memory.

The foregoing description, for purpose of explanation, has been described with reference to specific implementations. However, the illustrative discussions above are not intended to be exhaustive or to limit the claims to the precise forms disclosed. Many modifications and variations are possible in view of the above teachings. The implementations were chosen and described in order to best explain principles of operation and practical applications.

Therefore, it should be apparent that the aspects described herein may be embodied in a wide variety of forms and that any specific structure and/or function described herein is merely illustrative. Based on the present disclosure one skilled in the art should appreciate that an aspect described herein may be implemented independently of other aspects and that two or more of these aspects may be combined in various ways. For example, an apparatus may be implemented and/or a method may be practiced using any number of the aspects set forth herein. In addition, such an apparatus may be implemented and/or such a method may be practiced using other structure and/or functionality in addition to or other than one or more of the aspects set forth herein.

It will be understood that, although the terms "first," "second," etc. may be used herein to describe various elements, these elements should not be limited by these terms. These terms are only used to distinguish one element from another. For example, a first contact could be termed a second contact, and, similarly, a second contact could be termed a first contact, which changing the meaning of the description, so long as all occurrences of the "first contact" are renamed consistently and all occurrences of the second contact are renamed consistently. The first contact and the second contact are both contacts, but they are not the same contact.

The terminology used herein is for the purpose of describing particular embodiments only and is not intended to be limiting of the claims. As used in the description of the embodiments and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" may be construed to mean "when" or "upon" or "in response to determining" or "in accordance with a determination" or "in response to detecting," that a stated condition precedent is true, depending on the context. Similarly, the phrase "if it is determined [that a stated condition precedent is true]" or "if [a stated condition precedent is true]" or "when [a stated condition precedent is true]" may be construed to mean "upon determining" or "in response to determining" or "in accordance with a determination" or "upon detecting" or "in response to detecting" that the stated condition precedent is true, depending on the context.

What is claimed is:

1. A method of estimating error propensities of two or more portions of memory, wherein the two or more portions of memory are each used to store respective portions of each codeword in a set of codewords, the method comprising:
   reading data from memory comprising one or more codewords in the set of codewords, each codeword of the one or more codewords read from memory including two or more portions that are each read from a distinct portion of the two or more portions of memory; and
   computing two or more error propensity metrics, each error propensity metric corresponding to a respective portion of memory, wherein each error propensity metric is computed using a corresponding sub-matrix of a parity check matrix associated with the set of codewords and the respective portions of the one or more codewords read from the corresponding portion of memory.

2. The method of claim 1, further comprising:
   determining whether a respective error propensity metric, of the two or more error propensity metrics, satisfies remedial correction criteria, the remedial correction criteria including a criterion that the respective error propensity metric is outside a threshold range; and in response to determining that the respective error propensity metric is outside the threshold range, performing a remedial operation on the portion of memory corresponding to the respective error propensity metric that has been determined to be outside the threshold range.

3. The method of claim 1, further comprising:

identifying a respective error propensity metric, of the two or more error propensity metrics, that satisfies remedial correction criteria, the remedial correction criteria including a criterion that the identified respective error propensity metric is outside a range associated with one or more other error propensity metrics of the two or more error propensity metrics; and in response to identifying the respective error propensity metric, performing a remedial operation on the portion of memory corresponding to the identified respective error propensity metric.

4. The method of claim 2, wherein the remedial operation comprises adjusting a reading signal level used to read the corresponding one of the two or more portions of memory.

5. The method of claim 4, wherein the reading signal level includes a reading threshold voltage.

6. The method of claim 2, wherein the remedial operation comprises:

performing one or more additional read operations of the corresponding one of the two or more portions of memory using one or more reading signal levels; and producing a soft information value using the results of the one or more additional read operations.

7. The method of claim 2, wherein the remedial operation comprises selecting soft information values from a characterization vector based on one or more characterization parameter values associated with a current state of the corresponding one of the two or more portions of memory.

8. The method of claim 7, wherein the remedial operation further comprises adjusting the selected soft information values based on the error propensity metric identified as outside the threshold range.

9. The method of claim 1, wherein each of the two or more sub-matrices comprises a sub-optimal parity check matrix within the parity check matrix associated with the whole codeword.

10. The method of claim 1, wherein computing the two or more error propensity metrics comprises computing two or more sub-syndrome matrices, wherein each sub-syndrome matrix is a function of a corresponding one of the two or more portions of the codeword and a corresponding one of the two or more sub-matrices.

11. The method of claim 10, wherein computing the two or more error propensity metrics comprises computing two or more probability values, wherein each probability value is representative of a likelihood that an element of a corresponding one of the two or more sub-syndrome matrices has a first predefined value.

12. The method of claim 11, wherein each probability value is a function of a dividend value indicative of a summation of elements, in a corresponding one of the two or more sub-syndrome matrices, that have a first predefined value, and a divisor value corresponding to the number of rows in a corresponding one of the two or more first sub-matrices.

13. The method of claim 11, wherein computing the two or more error propensity metrics comprises computing two or more bit error rate values, wherein each bit error rate value is a function of a corresponding one of the two or more probability values and a respective syndrome weight associated with a corresponding one of the two or more first sub-matrices.

14. The method of claim 10, wherein computing the two or more error propensity metrics comprises retrieving two or more bit error rate ranges, wherein each bit error rate range is associated with a corresponding one of the two or more sub-syndrome matrices.

15. The method of claim 14, wherein retrieving the two or more bit error rate ranges includes selecting from a characterization vector based on one or more characterization parameter values associated with a current state of the corresponding one of the two or more portions of memory.

16. The method of claim 1, wherein the codeword is a low density parity check (LDPC) codeword.

17. The method of claim 1, wherein the two or more portions of memory are substantially independent from one another.

18. The method of claim 1, wherein each of the two or more portions of memory includes at least one of a memory die having an array of memory cells, a block of memory cells, a plane of memory cells, a word line of memory cells.

19. A non-transitory computer readable medium including instructions for estimating error propensities of two or more portions of memory, wherein the two or more portions of memory are each used by to store respective portions of each codeword in a set of codewords, the instructions when executed by a processor cause a device to:

read data from memory comprising one or more codewords in the set of codewords, each codeword of the one or more codewords read from memory including two or more portions that are each read from a distinct portion of the two or more portions of memory; and compute two or more error propensity metrics, each error propensity metric corresponding to a respective portion of memory, wherein each error propensity metric is computed using a corresponding sub-matrix of a parity check matrix associated with the set of codewords and the respective portions of the one or more codewords read from the corresponding portion of memory.

20. A memory controller configured to estimating error propensities of two or more portions of memory, wherein the two or more portions of memory are each used to store respective portions of each codeword in a set of codewords, the memory controller comprising:

a storage medium interface configured to read data from memory comprising one or more codewords in the set of codewords, each codeword of the one or more codewords read from memory including two or more portions that are each read from a distinct portion of the two or more portions of memory; and a sub-matrix error detection module configured to identify whether one of the two or more portions of memory has a relatively higher error propensity than the others by determining a corresponding error propensity metric for each of the two or more portions of memory based on a corresponding sub-matrix of a parity check matrix associated with the set of codewords and the respective portions of the one or more codewords read from the corresponding portion of memory.

21. The memory controller of claim 20, wherein the sub-matrix error detection module comprises:

an error propensity metric calculator configured to compute the two or more error propensity metrics, each error propensity metric corresponding to a respective portion of memory, wherein each error propensity metric is computed using the corresponding sub-matrix of the parity check matrix associated with the set of codewords and the respective portions of the one or more codewords read from the corresponding portion of memory.

22. The memory controller of claim 20, wherein the sub-matrix error detection module comprises:
a comparator configured to determine whether a respective error propensity metric, of the two or more error propensity metrics, satisfies remedial correction criteria, the remedial correction criteria including a criterion that the respective error propensity metric is outside a threshold range.

23. The memory controller of claim 20, wherein the sub-matrix error detection module comprises:
a comparator configured to identify a respective error propensity metric, of the two or more error propensity metrics, that satisfies remedial correction criteria, the remedial correction criteria including a criterion that the identified respective error propensity metric is outside a range associated with one or more other error propensity metrics of the two or more error propensity metrics.

24. The memory controller of claim 20, wherein the sub-matrix error detection module comprises:
a remedial read module configured to perform a remedial operation on the portion of memory having a relatively higher error propensity than the others based on the determined error propensity metrics.

25. The memory controller of claim 24, wherein the remedial operation comprises adjusting a reading signal level used to read the corresponding one of the two or more portions of memory.

26. The memory controller of claim 25, wherein the reading signal level includes a reading threshold voltage.

27. The memory controller of claim 25, wherein the remedial operation comprises:
performing one or more additional read operations of the corresponding one of the two or more portions of memory using one or more reading signal levels; and
producing a soft information value using the results of the one or more additional read operations.

28. The memory controller of claim 25, wherein the remedial operation comprises selecting soft information values from a characterization vector based on one or more characterization parameter values associated with a current state of the corresponding one of the two or more portions of memory.

29. The memory controller of claim 25, wherein the remedial operation further comprises adjusting the selected soft information values based on the error propensity metric identified as outside the threshold range.

30. The memory controller of claim 20, wherein computing the two or more error propensity metrics comprises computing two or more sub-syndrome matrices, wherein each sub-syndrome matrix is a function of a corresponding one of the two or more portions of the codeword and a corresponding one of the two or more sub-matrices, and computing two or more probability values, wherein each probability value is representative of a likelihood that an element of a corresponding one of the two or more sub-syndrome matrices has a first predefined value.

* * * * *